United States Patent
Ota et al.

(10) Patent No.: US 10,584,282 B2
(45) Date of Patent: Mar. 10, 2020

(54) ELECTRONIC DEVICE AND METHOD FOR PRODUCING SAME

(71) Applicant: KURARAY CO., LTD., Kurashiki-shi (JP)

(72) Inventors: Masahiko Ota, Kurashiki (JP); Yasutaka Inubushi, Kurashiki (JP); Ryoichi Sasaki, Kurashiki (JP); Yasushi Morihara, Kurashiki (JP); Masakazu Nakaya, Kurashiki (JP)

(73) Assignee: KURARAY CO., LTD., Kurashiki-shi (JP)

( * ) Notice: Subject to any disclaimer, the term of this patent is extended or adjusted under 35 U.S.C. 154(b) by 191 days.

(21) Appl. No.: 15/539,524

(22) PCT Filed: Dec. 24, 2015

(86) PCT No.: PCT/JP2015/006460
§ 371 (c)(1),
(2) Date: Jun. 23, 2017

(87) PCT Pub. No.: WO2016/103720
PCT Pub. Date: Jun. 30, 2016

(65) Prior Publication Data
US 2019/0055467 A1    Feb. 21, 2019

(30) Foreign Application Priority Data

Dec. 24, 2014  (JP) ................. 2014-261118
Jan. 13, 2015  (JP) ................. 2015-004432
May 27, 2015  (JP) ................. 2015-107959
Sep. 17, 2015  (JP) ................. 2015-184412

(51) Int. Cl.
| | | |
|---|---|---|
| B32B 9/00 | (2006.01) | |
| B82Y 20/00 | (2011.01) | |
| B82Y 40/00 | (2011.01) | |
| C09K 11/02 | (2006.01) | |
| C09D 129/04 | (2006.01) | |
| H01L 33/62 | (2010.01) | |
| C09K 11/70 | (2006.01) | |
| C09D 143/02 | (2006.01) | |
| C08F 130/02 | (2006.01) | |
| C09D 7/40 | (2018.01) | |
| C09D 5/22 | (2006.01) | |
| C09D 171/02 | (2006.01) | |
| C09K 11/08 | (2006.01) | |
| H01L 33/50 | (2010.01) | |
| B82Y 30/00 | (2011.01) | |
| H01L 33/48 | (2010.01) | |
| H01L 33/58 | (2010.01) | |

(52) U.S. Cl.
CPC ............. C09K 11/706 (2013.01); B32B 9/00 (2013.01); C08F 130/02 (2013.01); C09D 5/22 (2013.01); C09D 7/67 (2018.01); C09D 129/04 (2013.01); C09D 143/02 (2013.01); C09D 171/02 (2013.01); C09K 11/02 (2013.01); C09K 11/0883 (2013.01); H01L 33/502 (2013.01); B82Y 20/00 (2013.01); B82Y 30/00 (2013.01); B82Y 40/00 (2013.01); H01L 33/486 (2013.01); H01L 33/505 (2013.01); H01L 33/507 (2013.01); H01L 33/58 (2013.01); H01L 33/62 (2013.01); H01L 2224/48091 (2013.01); H01L 2224/48247 (2013.01); H01L 2933/0041 (2013.01)

(58) Field of Classification Search
None
See application file for complete search history.

(56) References Cited

U.S. PATENT DOCUMENTS

| | | | |
|---|---|---|---|
| 2005/0135079 A1 | 6/2005 | Yin Chua et al. | |
| 2006/0081862 A1 | 4/2006 | Chua et al. | |
| 2006/0157686 A1 | 7/2006 | Jang et al. | |
| 2012/0006387 A1 | 1/2012 | Adachi | |
| 2013/0034674 A1* | 2/2013 | Yoshida ........... | C09D 123/02 |
| | | | 428/35.2 |
| 2014/0248450 A1 | 9/2014 | Sasaki et al. | |
| 2015/0155409 A1 | 6/2015 | Nakaya et al. | |
| 2015/0373858 A1 | 12/2015 | Sasaki et al. | |
| 2017/0096538 A1 | 4/2017 | Sasaki et al. | |

FOREIGN PATENT DOCUMENTS

| | | |
|---|---|---|
| JP | 2003-251732 A | 9/2003 |
| JP | 2006-114909 A | 4/2006 |
| JP | 2006-199963 A | 8/2006 |
| JP | 2013-169704 A | 9/2013 |
| JP | 2013-208793 A | 10/2013 |
| JP | 2013-208915 A | 10/2013 |
| JP | WO 2014/122940 A1 | 8/2014 |
| JP | 5873957 B1 | 3/2016 |
| KR | 10-2013-0018282 A | 2/2013 |
| WO | WO 2010/109947 A1 | 9/2010 |
| WO | WO 2013/051288 A1 | 4/2013 |
| WO | WO 2013/187064 A1 | 12/2013 |

OTHER PUBLICATIONS

International Search Report dated Mar. 22, 2016, in PCT/JP2015/006460 filed Dec. 24, 2015.

* cited by examiner

*Primary Examiner* — Sheeba Ahmed
(74) *Attorney, Agent, or Firm* — Oblon, McClelland, Maier & Neustadt, L.L.P.

(57) ABSTRACT

The present invention relates to a fluorescent quantum dot-containing electronic device including a protective sheet. The protective sheet includes a multilayer structure (W) including a base (X) and a layer (Y) stacked on the base (X), the layer (Y) contains a reaction product (D) of an aluminum-containing compound (A) and a phosphorus compound (B), and the reaction product (D) has an average particle diameter of 5 to 50 nm.

15 Claims, 6 Drawing Sheets

ELECTRONIC DEVICE AND METHOD FOR PRODUCING SAME

TECHNICAL FIELD

The present invention relates to an electronic device and a method for producing the electronic device. The present invention more particularly relates to: a fluorescent quantum dot-containing electronic device including a protective sheet including a multilayer structure including a base (X) and a layer (Y) stacked on the base (X): and a method for producing the electronic device.

BACKGROUND ART

Composite structures having a gas barrier layer containing aluminum have hitherto been proposed for use in electronic devices such as a liquid crystal display of a display apparatus, and examples of the composite structures include a composite structure having a transparent gas barrier layer composed of a reaction product of aluminum oxide particles and a phosphorus compound (see Patent Literature 1).

Patent Literature 1 discloses a method for forming the gas barrier layer, in which a coating liquid containing aluminum oxide particles and a phosphorus compound is applied onto a plastic film, then dried and heat-treated.

However, the above conventional gas barrier layer may experience deterioration in gas barrier performance and fail to maintain sufficient gas barrier properties over a long period of time under hot and humid conditions.

In recent years, electronic devices such as a light-emitting diode (LED) have come to incorporate quantum dots as a fluorescent material that converts the wavelength of incident light and emits the wavelength-converted light. A quantum dot (QD) is a light-emitting semiconductor nanoparticle that typically has a diameter on the order of 1 to 20 nm. In the quantum dot, electrons are quantum-confined within a three-dimensional, sharply-outlined, nanoscale semiconductor crystal. Such fluorescent quantum dots are prone to aggregation and can be degraded, for example, by oxygen, for which reason they are generally dispersed in a medium such as a resin when used.

Patent Literature 2 describes a flash module having quantum dots dispersed in a matrix composed of a sol, gel, polymethylmethacrylate (PMMA), polystyrene, polycarbonate, UV-curable resin, or thermosetting resin such as an epoxy.

Even when fluorescent quantum dots are dispersed in a resin, however, they may be degraded, for example, by atmospheric oxygen or water.

CITATION LIST

Patent Literature

Patent Literature 1: JP 2003-251732 A
Patent Literature 2: JP 2006-114909 A

SUMMARY OF INVENTION

Technical Problem

An object of the present invention is to provide a fluorescent quantum dot-containing electronic device that has good optical properties and exhibits high barrier performance both before and after a damp heat test. Another object of the present invention is to provide a fluorescent quantum dot-containing electronic device that resists degradation by atmospheric oxygen or water in long-term use. The term "gas barrier properties" as used herein refers to the ability to function as a barrier against gasses other than water vapor, unless otherwise specified. The simpler term "barrier properties" as used herein refers to both gas barrier properties and water vapor barrier properties. The term "optical properties" as used herein refers to total light transmittance and haze value.

Solution to Problem

As a result of a detailed study, the present inventors have found that a fluorescent quantum dot-containing electronic device covered by a protective sheet including a multilayer structure including particular layers meets the above objects, and have made the present invention on the basis of the finding.

The present invention provides a fluorescent quantum dot-containing electronic device including a protective sheet, wherein the protective sheet includes a multilayer structure (W) including a base (X) and a layer (Y) stacked on the base (X), the layer (Y) contains a reaction product (D) of an aluminum-containing compound (A) and a phosphorus compound (B), and the reaction product (D) has an average particle diameter of 5 to 50 nm.

The fluorescent quantum dot-containing electronic device of the present invention includes a layer containing fluorescent quantum dots, and the protective sheet may be disposed on one side or both sides of the layer.

In the protective sheet of the fluorescent quantum dot-containing electronic device of the present invention, the phosphorus compound (B) may be an inorganic phosphorus compound (BI).

In the protective sheet of the fluorescent quantum dot-containing electronic device of the present invention, the aluminum-containing compound (A) may be an aluminum-containing metal oxide (Aa).

In the protective sheet of the fluorescent quantum dot-containing electronic device of the present invention, the average particle diameter of the reaction product (D) may be 20 to 40 nm.

The protective sheet of the fluorescent quantum dot-containing electronic device of the present invention may have a moisture permeability of 1.0 g/(m$^2$·day) or less at 40° C. and 90% RH.

In the protective sheet of the fluorescent quantum dot-containing electronic device of the present invention, the base (X) may include a thermoplastic resin film.

The layer (Y) may contain a polymer (F) having at least one functional group selected from the group consisting of a carbonyl group, a hydroxy group, a carboxyl group, a carboxylic anhydride group, and a salt of a carboxyl group.

In the electronic device of the present invention, the multilayer structure (W) may further include a layer (Z) disposed contiguous to the layer (Y). The layer (Z) may contain a polymer (BOa) having a phosphorus atom-containing functional group.

The polymer (BOa) contained in the layer (Z) may be poly(vinylphosphonic acid) or poly(2-phosphonooxyethyl methacrylate).

The present invention also provides a method for producing the fluorescent quantum dot-containing electronic device, the electronic device including a protective sheet, the protective sheet including a multilayer structure (W) including a base (X) and a layer (Y) stacked on the base (X), the layer (Y) containing a reaction product (D) of an aluminum-containing compound (A) and a phosphorus compound (B), the method including the steps of: (I) applying a coating liquid (S) containing the aluminum-containing compound (A), the phosphorus compound (B), and a solvent onto the base (X) to form a layer (Y) precursor containing a reaction product (D) precursor; and (II) heat-treating the layer (Y) precursor at a temperature of 140° C. or higher to form the layer (Y), wherein the layer (Y) precursor formed in the step (I) has a solvent content of 0.4 wt % or less, and the reaction product (D) precursor has an average particle diameter of less than 5 nm.

In the method of the present invention for producing the electronic device, the phosphorus compound (B) may be an inorganic phosphorus compound (BI).

In the method of the present invention for producing the electronic device, the aluminum-containing compound (A) may be an aluminum-containing metal oxide (Aa).

In the method of the present invention for producing the electronic device, the step (I) may include a drying step of removing the solvent from the coating liquid (S) after applying the coating liquid (S) onto the base (X), and a drying temperature in the drying step may be lower than 140° C.

The method of the present invention for producing the electronic device may be adapted so that, in an infrared absorption spectrum of the layer (Y) precursor, a ratio $A_R/A_P$ of a maximum $A_R$ of absorbance in a region from 1,080 to 1,130 $cm^{-1}$ to a maximum $A_P$ of absorbance in a region from 850 to 950 $cm^{-1}$ is 2.0 or less.

Advantageous Effects of Invention

According to the present invention, it is possible to obtain a fluorescent quantum dot-containing electronic device that has good optical properties and exhibits high barrier performance both before and after a damp heat test. According to the present invention, it is also possible to obtain a fluorescent quantum dot-containing electronic device that resists degradation by atmospheric oxygen or water in long-term use. It is further possible to obtain a fluorescent quantum dot-containing electronic device that suffers less degradation and retains its performance at a high level even after long-term use (light emission for 2,000 consecutive hours, for example) in air.

DESCRIPTION OF EMBODIMENTS

Hereinafter, the present invention will be described with reference to examples. The following description gives examples of materials, conditions, techniques, and value ranges; however, the present invention is not limited to those mentioned as examples. The materials given as examples may be used alone or may be used in combination with one another, unless otherwise specified.

Unless otherwise specified, the meaning of an expression like "a particular layer is stacked on a particular member (such as a base or layer)" as used herein encompasses not only the case where the particular layer is stacked in contact with the member but also the case where the particular layer is stacked above the member, with another layer interposed therebetween. The same applies to expressions like "a particular layer is formed on a particular member (such as a base or layer)" and "a particular layer is disposed on a particular member (such as a base or layer)". Unless otherwise specified, the meaning of an expression like "a liquid (such as a coating liquid) is applied onto a particular member (such as a base or layer)" encompasses not only the case where the liquid is applied directly to the member but also the case where the liquid is applied to another layer formed on the member.

[Electronic Device]

A fluorescent quantum dot-containing electronic device including a multilayer structure (W) of the present invention includes an electronic device body and a protective sheet covering the surface of the electronic device body. The protective sheet used in the electronic device of the present invention includes a multilayer structure (W) including a base (X) and a layer (Y) stacked on the base (X). The details of the multilayer structure (W) will be described later. The protective sheet may consist only of the multilayer structure (W) or may further include another member or another layer. The following should be considered a description of the case where the protective sheet includes the multilayer structure (W), unless otherwise specified.

Figure 1:
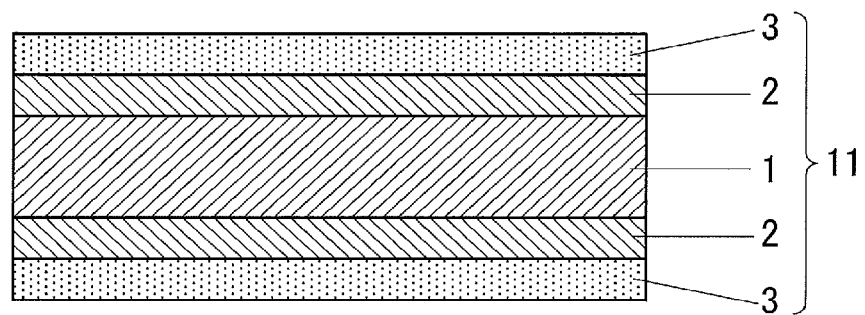
FIG. 1 is a partial cross-sectional view of an electronic device according to an embodiment of the present invention.

A partial cross-sectional view of an example of the electronic device of the present invention is shown in FIG. 1. An electronic device 11 of FIG. 1 includes an electronic device body 1, a sealing member 2 for sealing the electronic device body 1, and a protective sheet 3 for protecting the surface of the electronic device body 1. The sealing member 2 covers the entire surface of the electronic device body 1. It suffices for the protective sheet 3 to be placed in such a manner as to protect the surface of the electronic device body 1. The protective sheet 3 may be disposed directly on the surface of the electronic device body 1 (this case is not shown) or may, as shown in FIG. 1, be disposed over the surface of the electronic device body 1 with another member such as the sealing member 2 interposed therebetween. As shown in FIG. 1, a first protective sheet may be disposed on one side, while a second protective sheet may be disposed on the opposite side. In this case, the second protective sheet disposed on the opposite side may be the same as or different from the first protective sheet.

A preferred protective sheet protects a fluorescent quantum dot-containing member from ambient factors such as high temperature, oxygen, and moisture. Examples of the preferred protective sheet include a non-yellowed, transparent optical material that is hydrophobic, that is chemically and mechanically compatible with the fluorescent quantum dot-containing member, that exhibits light stability and chemical stability, and that has resistance to high temperature. It is preferable that at least one protective sheet be refractive index-matched to the fluorescent quantum dot-containing member. In a preferred embodiment, the matrix of the fluorescent quantum dot-containing member and at least one protective sheet contiguous to the fluorescent quantum dot-containing member are refractive index-matched to have close refractive indices, so that a majority of light traveling toward the fluorescent quantum dot-containing member through the protective sheet enters the fluorescent material from the protective sheet. This refractive index matching reduces optical loss at the interface between the protective sheet and the matrix.

Examples of the matrix of the fluorescent quantum dot-containing member of the present invention include a polymer, an organic oxide, and an inorganic oxide. In a preferred embodiment, the polymer is substantially semi-transparent or substantially transparent. Preferred examples of the matrix include the following as well as the later-described resin used as a dispersion medium: epoxy; acrylate; norbornene; polyethylene; poly(vinyl butyral); poly(vinyl acetate); polyurea; polyurethane; silicones and silicone derivatives such as amino silicone (AMS), polyphenylmethylsiloxane, polyphenylalkylsiloxane, polydiphenylsiloxane, polydialkylsiloxane, silsesquioxane, fluorinated silicone, and vinyl- or hydride-substituted silicone; acrylic polymers and copolymers formed from monomers such as methyl methacrylate, butyl methacrylate, and lauryl methacrylate; styrene polymers such as polystyrene, amino polystyrene (APS), and poly(acrylonitrile ethylene styrene) (AES); polymers that are cross-linked with a Bifunctional monomer such as divinylbenzene; crosslinkers suitable for crosslinking with ligand materials; and epoxides which combine with ligand amines (such as APS or PEI ligand amines) to form epoxy.

The protective sheet of the present invention is preferably a solid material. Examples of the solid material include a cured liquid, a gel, and a polymer. The protective sheet may contain a flexible or non-flexible material depending on the intended application. The protective sheet is preferably in the form of a flat layer, and may have any geometry and surface morphology suitable for the intended lighting application. Preferred materials for use in the protective sheet include any materials for protective sheets which are known to be preferred in the art, as well as the materials for the multilayer structure (W) described later. Examples of preferred barrier materials for use in the protective sheet other than the multilayer structure (W) include glass, a polymer, and an oxide. Examples of the polymer include polyethylene terephthalate (PET). Examples of the oxide include $SiO_2$, $Si_2O_3$, $TiO_2$, and $Al_2O_3$. These may be used alone or may be used in combination with one another. The protective sheet of the present invention preferably includes at least two layers (such as the base (X) and layer (Y)) containing different materials or compositions. In this case, the multilayer protective sheet will be free of, or have a reduced number of, pinhole defects and provide an effective barrier against invasion of oxygen and moisture into the fluorescent quantum dot-containing member. The material, thickness, and number of protective sheets depend on the intended application, and are preferably selected so that the thickness of the fluorescent quantum dot-containing electronic device is minimized while the barrier protection and brightness of the fluorescent quantum dots are maximized. In a preferred embodiment, the or each protective sheet includes a layered product (layered film), preferably a double-layer product (double-layer film), and the or each protective sheet is thick enough to avoid being wrinkled during a production process such as a roll-to-roll process or stacking process. In an embodiment where the fluorescent quantum dot-containing member further contains a heavy metal or another toxic substance, the number or thickness of the protective sheets depend on legal regulations for toxicity. Such regulations may require that a larger number of, or thicker protective sheets be used. Other factors to be considered for the barrier include cost, availability, and mechanical strength.

In a preferred embodiment, the fluorescent quantum dot-containing electronic device includes two or more protective sheets each including the multilayer structure (W), and these protective sheets are respectively contiguous to both sides of the fluorescent quantum dot-containing member. The electronic device may include, on each side of the fluorescent quantum dot-containing member, at least one protective sheet other than the protective sheet including the multilayer structure (W). That is, the electronic device may include two or three layers (protective sheets) on each side of the fluorescent quantum dot-containing member. In a more preferred embodiment, the fluorescent quantum dot-containing electronic device includes two protective sheets on each side of the fluorescent quantum dot-containing member, and at least one of the two protective sheets is the protective sheet including the multilayer structure (W).

The fluorescent quantum dot-containing layer in the present invention can have any desired dimensions, form, structure, and thickness. The fluorescent quantum dots may be embedded in a matrix at any density appropriate for the desired function. The thickness and width of the fluorescent quantum dot-containing layer can be controlled by any of methods known in the art such as wet coating, spread coating, rotary coating, and screen printing. In a fluorescent quantum dot-containing film according to a particular embodiment, the fluorescent quantum dot-containing member can have a thickness of 500 µm or less, preferably 250 µm or less, more preferably 200 µm or less, even more preferably 50 to 150 µm, most preferably 50 to 100 µm.

In a preferred embodiment, the fluorescent quantum dot-containing electronic device of the present invention has top and bottom protective sheet layers that are attached in a mechanically hermetic manner. As in the embodiment shown in FIG. 1, the top protective sheet layer and the bottom protective sheet layer are compressed together to seal the fluorescent quantum dot-containing member. Preferably, the edges of the protective sheet layers are compressed immediately after placement of the fluorescent quantum dot-containing member and protective sheet layers so as to minimize exposure of the fluorescent quantum dot-containing member to ambient oxygen and moisture.

The edges of the barriers can be hermetically attached, for example, by compression, stamping, melting, rolling, or pressing.

In a preferred embodiment, an adhesive may be used to attach the top and bottom protective sheet layers of the fluorescent quantum dot-containing electronic device of the present invention in a mechanically hermetic manner. In terms of ease of edge bonding and maintenance of good optical properties of the quantum dots, it is preferable to use a suitable optical adhesive material such as an epoxy resin.

The fluorescent quantum dot-containing electronic device body of the present invention can be used in various applications, including: backlight units (BLU) for displays of electronic devices such as a liquid crystal display (LCD), a television, a computer, a mobile phone, a smartphone, a personal digital assistant (PDA), a video game console, an electronic book reader, and a digital camera; and indoor or outdoor lighting applications (such as stage lighting, decorative lighting, accent lighting, and museum lighting).

The fluorescent quantum dot-containing electronic device body of the present invention can be used also as a quantum dot-containing down-conversion layer or film suitable for use in photovoltaic applications. The fluorescent quantum dot-containing electronic device body of the present invention is capable of converting a portion of sunlight to lower-energy light absorbable by the active layer of a solar cell. The converted light resulting from the down conversion by the fluorescent quantum dot-containing electronic device body of the present invention has a wavelength that allows the active layer to absorb the light and convert the absorbed light to electrical power. Thus, a solar cell employing the fluorescent quantum dot-containing electronic device body of the present invention can have an enhanced solar conversion efficiency.

The fluorescent quantum dot-containing electronic device body of the present invention can be used also as a light source, a light filter, and/or a down-converter for primary light. In a particular embodiment, the fluorescent quantum dot-containing electronic device body of the present invention is a primary light source, and the fluorescent quantum dot-containing electronic device is an electroluminescent device containing electroluminescent quantum dots that emit photons upon electrical stimulation. In a particular embodiment, the fluorescent quantum dot-containing electronic device is a light filter, and the fluorescent quantum dots absorb light of a particular wavelength or in a particular wavelength range. The fluorescent quantum dot-containing electronic device permits passage of light of a particular wavelength or in a particular wavelength range while absorbing or filtering out light of other wavelengths. In a particular embodiment, the fluorescent quantum dot-containing electronic device is a down-converter. In this case, at least a portion of primary light from a primary light source is absorbed by the fluorescent quantum dots in the fluorescent quantum dot-containing electronic device so that secondary light having a lower energy or a longer wavelength than the primary light is emitted. In a preferred embodiment, the fluorescent quantum dot-containing electronic device functions both as a filter and as a down-converter for primary light. In this case, a first portion of primary light is permitted to pass through the fluorescent quantum dot-containing electronic device without being absorbed by the fluorescent quantum dots in the fluorescent quantum dot-containing electronic device, while at least a second portion of the primary light is absorbed by the fluorescent quantum dots and down-converted to secondary light having a lower energy or a longer wavelength than the primary light.

The sealing member 2 is an optional member which may be added as appropriate depending on, for example, the type and use of the electronic device body 1. Examples of the material of the sealing member include ethylene-vinyl acetate copolymers, polyvinyl butyral resins, silicone resins, epoxy resins, urethane resins, cellulose resins, polystyrene resins, and styrene-butadiene copolymers.

The protective sheet of the fluorescent quantum dot-containing electronic device of the present invention may have flexibility. "Flexibility" as defined herein refers to the ability to be wound into a 50-cm-diameter roll. For example, having "flexibility" means that the 50-cm-diameter roll is free of any damage when visually inspected. It is preferable for the electronic device or protective sheet to be capable of being wound into a roll with a diameter of less than 50 cm, since this means that the electronic device or protective sheet has higher flexibility.

The protective sheet including the multilayer structure (W) has good gas barrier properties and good water vapor barrier properties, and exhibits good gas barrier properties and good water vapor barrier properties even under hot and humid conditions. The use of the protective sheet thus allows protection of fluorescent quantum dots, for example, from oxygen and water, thereby making it possible to obtain an electronic device that experiences little deterioration even in a harsh environment.

The multilayer structure (W) can be used as a film called a substrate film, examples of which include a substrate film for LCDs, a substrate film for organic ELs, and a substrate film for electronic paper. In this case, the multilayer structure may function both as a substrate and as a protective film. The electronic device to be protected by the protective sheet is not limited to those mentioned as examples above, and may be, for example, an IC tag, a device for optical communication, or a fuel cell.

The protective sheet may include a surface protection layer disposed on one or both of the surfaces of the multilayer structure (W). It is preferable for the surface protection layer to be a layer made of a scratch-resistant resin. A surface protection layer for a device such as a solar cell which may be used outdoors is preferably made of a resin having high weather resistance (e.g., light resistance). For protecting a surface required to permit transmission of light, a surface protection layer having high light transmissivity is preferred. Examples of the material of the surface protection layer (surface protection film) include acrylic resins, polycarbonate, polyethylene terephthalate, polyethylene naphthalate, ethylene-tetrafluoroethylene copolymer, polytetrafluoroethylene, 4-fluoroethylene-perchloroalkoxy copolymer, 4-fluoroethylene-6-fluoropropylene copolymer, 2-ethylene-4-fluoroethylene copolymer, polychlorotrifluoroethylene, polyvinylidene fluoride, and polyvinyl fluoride. In an example, the protective sheet includes an acrylic resin layer disposed on one of its sides.

An additive (e.g., an ultraviolet absorber) may be added to the surface protection layer to increase the durability of the surface protection layer. A preferred example of the surface protection layer having high weather resistance is an acrylic resin layer to which an ultraviolet absorber has been added. Examples of the ultraviolet absorber include, but are not limited to, ultraviolet absorbers based on benzotriazole, benzophenone, salicylate, cyanoacrylate, nickel, or triazine. In addition, another additive such as a stabilizer, light stabilizer, or antioxidant may be used in combination.

When the protective sheet is joined to the sealing member for sealing the fluorescent quantum dot-containing electronic device body, it is preferable for the protective sheet to include a resin layer for joining which is highly adhesive to the sealing member. Examples of the resin layer for joining which may be used when the sealing member is formed of ethylene-vinyl acetate copolymer include a polyethylene terephthalate layer with improved adhesion to ethylene-vinyl acetate copolymer. The layers constituting the protective sheet may be bonded together using a known adhesive or an adhesive layer as described above.

First Embodiment

A fluorescent quantum dot-containing electronic device according to the first embodiment of the present invention employs a fluorescent quantum dot-dispersed resin shaped product. The fluorescent quantum dot-dispersed resin shaped product can be obtained by dispersing fluorescent quantum dots in a resin to prepare a dispersion (composition) and forming a shaped product from the dispersion. The method for shaping is not particularly limited, and any known method can be used. The resin as a dispersion medium is preferably a cycloolefin (co)polymer. Examples of the cycloolefin (co)polymer include a cycloolefin polymer (COP) represented by the formula [Q-1] below and a cycloolefin copolymer (COC) represented by the formula [Q-2] below. As such a cycloolefin (co)polymer there can be used a commercially-available product. Examples of commercially-available products of the COP type include ZEONEX (registered trademark) series (manufactured by Zeon Corporation), and examples of commercially-available products of the COC type include APL 5014DP (manufactured by Mitsui Chemicals, Inc. and having a chemical structure represented by $-(C_2H_4)_x(C_{12}H_{16})_y-$, where x and y are real numbers of more than 0 and less than 1 which represent the copolymerization ratio).

[Chemical formula 1]

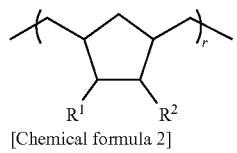

[Q-1]

[Chemical formula 2]

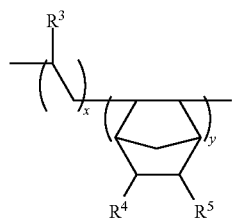

[Q-2]

In the formula [Q-1], $R^1$ and $R^2$, which may be the same or different, each independently represent a monovalent group selected from the group consisting of a hydrogen atom; a linear or branched saturated hydrocarbon group (preferably alkyl group) having 1 to 6 carbon atoms; a halogen atom selected from a chlorine atom and a fluorine atom; and a trihalomethyl group in which the halogen atom is a chlorine atom or a fluorine atom. When $R^1$ and $R^2$ are each a hydrocarbon group, the hydrocarbon groups may bind to each other at their neighboring substitution sites to form at least one 5 to 7-membered ring structure of a saturated hydrocarbon. r is a positive integer.

In the formula [Q-2], $R^3$ represents a monovalent group selected from the group consisting of: a hydrogen atom; a linear or branched saturated hydrocarbon group (preferably alkyl group) having 1 to 6 carbon atoms; a halogen atom selected from a chlorine atom and a fluorine atom; and a trihalomethyl group in which the halogen atom is a chlorine atom or a fluorine atom. $R^4$ and $R^5$, which may be the same or different, each independently represent a monovalent group selected from the group consisting of: a hydrogen atom; a linear or branched saturated hydrocarbon group (preferably alkyl group) having 1 to 6 carbon atoms; a halogen atom selected from a chlorine atom and a fluorine atom; and a trihalomethyl group in which the halogen atom is a chlorine atom or a fluorine atom. When $R^4$ and $R^5$ are each a hydrocarbon group, the hydrocarbon groups may bind to each other at their neighboring substitution sites to form at least one 5 to 7-membered ring structure of a saturated hydrocarbon. x and y are real numbers of more than 0 and less than 1 and satisfy a relationship of x+y=1.

The cycloolefin polymer (COP) represented by the formula [Q-1] can be obtained, for example, by ring-opening metathesis polymerization of a norbornene as a starting material with the aid of a catalyst such as a Grubbs catalyst, followed by hydrogenation. The cycloolefin copolymer (COC) represented by the formula [Q-2] can be obtained, for example, by copolymerization of a norbornene as a starting material with ethylene or the like with the aid of a catalyst such as a metallocene catalyst.

The method for dispersing the fluorescent quantum dots in the resin is preferably, but not limited to, a method in which a solution is prepared by dissolving the resin in a solvent under an inert gas atmosphere, then a dispersion prepared by dispersing the fluorescent quantum dots in a dispersion medium is added to the solution under an inert gas atmosphere, and the mixture is kneaded. The dispersion medium used in this case is preferably a solvent capable of dissolving the resin, and the dispersion medium is more preferably identical to the solvent used in the solution of the resin. Various solvents and dispersion mediums can be used without limitation. A hydrocarbon solvent such as toluene, xylene (o-, m-, or p-xylene), ethylbenzene, or tetralin can be preferably used. A chlorinated hydrocarbon solvent such as chlorobenzene, dichlorobenzene (o-, m-, or p-dichlorobenzene), or trichlorobenzene can also be used. Examples of the inert gas used in the above steps include helium gas, argon gas, and nitrogen gas. These gases may be used alone or may be used in combination by being mixed in appropriate proportions.

The fluorescent quantum dots used in the first embodiment are fluorescent particles that have a diameter of 1 to 100 nm and, when having a diameter of several tens of nanometers or less, exhibit a quantum effect. The particle diameter of the fluorescent quantum dots is preferably 2 to 20 nm.

The fluorescent quantum dots have a structure composed of a core which is an inorganic fluorescent material and a capping layer (e.g., an organic passivation layer having an aliphatic hydrocarbon group) coordinated with the surface of the inorganic fluorescent material. The core (metallic portion), which is an inorganic fluorescent material, is covered with the organic passivation layer. In general, fluorescent quantum dots have a core with the surface of which an organic passivation layer is coordinated for the main purpose of, for example, preventing aggregation. As well as serving to prevent aggregation, this organic passivation layer (also called "shell") performs the functions of: protecting the core particle from ambient chemical conditions;

imparting electrical stability to the surface of the particle; and controlling the solubility in a certain solvent system. The chemical structure of the organic passivation layer can be selected depending on the intended purpose. For example, an organic molecule may be selected which includes a linear or branched aliphatic hydrocarbon group (e.g., alkyl group) having about 6 to 18 carbon atoms.

[Inorganic Fluorescent Material]

Examples of the inorganic fluorescent material include nanocrystals of II-VI compound semiconductors and nanocrystals of III-V compound semiconductors. The form of these nanocrystals is not particularly limited, and examples of the nanocrystals include: a crystal having a core-shell structure in which an InP nanocrystal forming a core is covered with a shell formed of ZnS/ZnO or the like; a crystal having a structure having no clear boundary between a core and a shell and having a gradiently-varying composition; a mixed crystal in which two or more compound crystals are separately present in one and the same crystal; and an alloy of two or more nanocrystalline compounds.

[Capping Agent]

Examples of the capping agent (reagent for forming the organic passivation layer) that coordinates with the surface of the inorganic fluorescent material include an organic molecule having a linear or branched aliphatic hydrocarbon group having 2 to 30 carbon atoms, preferably 4 to 20 carbon atoms, more preferably 6 to 18 carbon atoms. The capping agent (reagent for forming the organic passivation layer) that coordinates with the surface of the inorganic fluorescent material has a functional group for coordination with the inorganic fluorescent material. Examples of such a functional group include carboxyl, amino, amide, nitrile, hydroxy, ether, carbonyl, sulfonyl, phosphonyl, and mercapto groups. Among these, a carboxyl group is preferred.

The composition used for fabrication of the fluorescent quantum dot-dispersed resin shaped product of the fluorescent quantum dot-containing electronic device according to the first embodiment contains a resin (e.g., cycloolefin (co)polymer) and fluorescent quantum dots dispersed uniformly in the resin at a concentration of 0.01 to 20 wt %. It is advantageous that the fluorescent quantum dot-containing composition according to the first embodiment contain a cycloolefin (co)polymer and fluorescent quantum dots uniformly dispersed in the cycloolefin (co)polymer, preferably at a concentration of more than 0.1 wt % and less than 15 wt %, more preferably at a concentration of more than 1 wt % and less than 10 wt %. It is not preferable that the concentration of the fluorescent quantum dots be less than 0.01 wt %, because in this case the fluorescent quantum dot-dispersed resin shaped product cannot provide an emission intensity sufficient for use in a light-emitting element. It is not preferable that the concentration of the fluorescent quantum dots be more than 20 wt %, because in this case the fluorescent quantum dots may undergo aggregation leading to failure to obtain a fluorescent quantum dot-dispersed resin shaped product in which the fluorescent quantum dots are uniformly dispersed.

[Method for Preparing Fluorescent Quantum Dots]

The fluorescent quantum dots used in the first embodiment are prepared as follows: A metal precursor that allows formation of desired compound semiconductor nanocrystals is used to produce nanocrystals, and the nanocrystals are then dispersed in an organic solvent and subsequently treated with a predetermined reactive compound (compound for forming the shell). In this way, fluorescent quantum dots each having a structure in which a hydrocarbon group coordinates with the surface of an inorganic fluorescent material can be prepared. The method for the treatment is not particularly limited, and an example is a method in which the dispersion of the nanocrystals is refluxed in the presence of the reactive compound. Another available example of the method for producing fluorescent quantum dots is a method disclosed in JP 2006-199963 A.

For the fluorescent quantum dots used in the first embodiment, the amount of the hydrocarbon groups in the organic passivation layer covering the surface of the inorganic fluorescent material (core) is not particularly limited. In general, the amount of the hydrocarbon groups is such that the content of the hydrocarbon chains of the hydrocarbon groups is 2 to 500 moles, preferably 10 to 400 moles, and more preferably 20 to 300 moles, per particle of the inorganic fluorescent material (core). If the content of the hydrocarbon chains is less than 2 moles, the function as an organic passivation layer cannot be provided, with the result that, for example, the particles of the fluorescent material are likely to undergo aggregation. If the content of the hydrocarbon chains is more than 500 moles, the intensity of emission from the core is reduced, in addition to which excess hydrocarbon groups having failed to coordinate with the inorganic fluorescent material remain, thus making performance degradation of a liquid sealing resin more likely. There also occurs an increase in cost of the fluorescent quantum dots.

The fluorescent quantum dot-dispersed resin shaped product according to the first embodiment may be produced by forming a fluorescent quantum dot-containing composition into a given shape. This shaped product performs the beneficial function of absorbing at least a portion of light applied from a light source and allowing the fluorescent quantum dots contained in the shaped product to emit secondary light. An example of the method for shaping the fluorescent quantum dot-containing composition is a method in which the composition is applied to a base or charged in a mold and dried by heating under an inert gas atmosphere as mentioned above to remove the solvent, and the dried composition is optionally separated from the base or mold. The fluorescent quantum dot-containing composition can be used also as a sealing member for sealing an LED chip.

An example of the method for producing the fluorescent quantum dot-dispersed resin shaped product is a method including the steps of: preparing a solution of a cycloolefin (co)polymer dissolved in a solvent; dispersing fluorescent quantum dots in the solution so that the concentration of the fluorescent quantum dots in the resulting shaped product will fall within the range of 0.01 to 20 wt %, and then kneading the dispersion to produce a fluorescent quantum dot-containing composition; and applying the fluorescent quantum dot-containing composition to a base or charging the fluorescent quantum dot-containing composition in a mold and then drying the composition by heating. The solvent and dispersion medium to be used are as previously described.

The production of the fluorescent quantum dot-dispersed resin shaped product by the above steps including drying by heating can optionally be followed by pressure forming to produce a resin lens, resin sheet, or resin film, for example.

Figure 2:
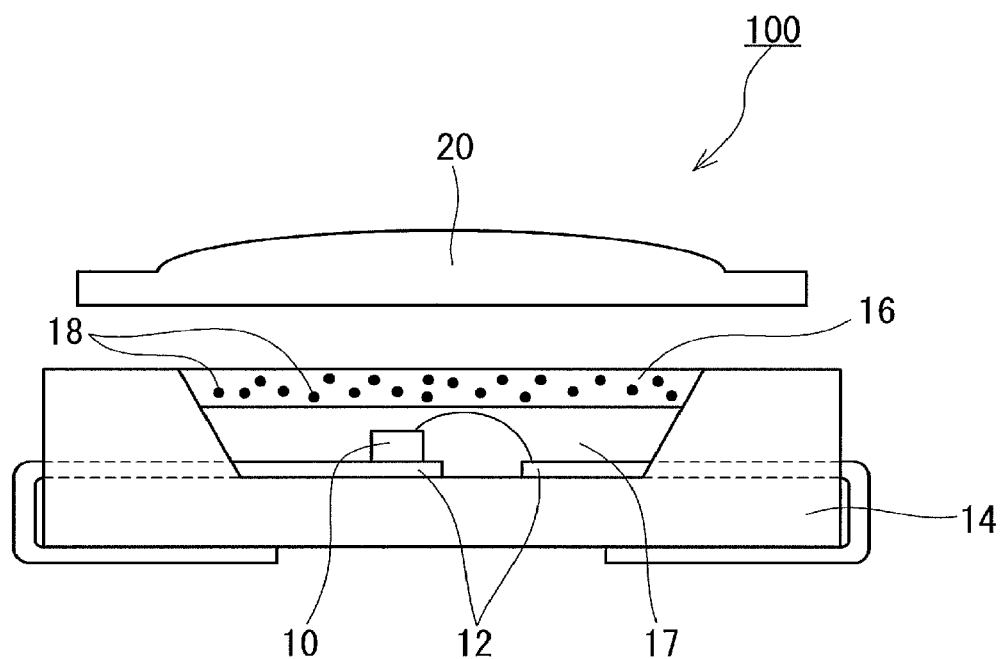
FIG. 2 is a cross-sectional view showing an exemplary light-emitting device in which a fluorescent quantum dot-containing composition according to the first embodiment of the present invention is used in at least a part of a sealing member.

FIG. 2 shows a cross-sectional view of an exemplary light-emitting device in which a fluorescent quantum dot-containing composition according to the first embodiment is used in at least a part of a sealing member. In FIG. 2, a light-emitting device 100 includes an LED chip 10, a leading electrode 12, a cup 14, and sealing members 16 and 17. A resin lens 20 may be placed over the light-emitting device 100 if desired. The cup 14 can be formed from an appropriate resin or ceramic. The LED chip 10 is not limited to a particular one, and a light-emitting diode that cooperates with fluorescent quantum dots to form a light source with a desired wavelength can be used. The sealing member 16 can be formed using a fluorescent quantum dot-containing composition in which fluorescent quantum dots 18 are dispersed. These components can together form, for example, a white-light source that emits white light through the sealing member 16 by making use of light emission from the LED chip 10. The sealing member 17 seals, for example, the LED and leading wire. These sealing members 16 and 17 can be produced as follows: A predetermined amount of resin (such as an epoxy or silicone resin) is first injected into the cup 14 under an atmosphere of inert gas (such as argon gas) and hardened by a known technique to form the sealing member 17, then the fluorescent quantum dot-containing composition is injected onto the sealing member 17 and dried by heating to form the sealing member 16.

A lens-shaped resin (resin lens 20), at least partially convex film, or uniformly-thick film formed of the fluorescent quantum dot-dispersed resin shaped product may be placed above the sealing member 16 held in the cup 14 so that light may be emitted through the resin lens 20. In this case, it is not necessary to disperse the fluorescent quantum dots 18 in the sealing member 16. When the fluorescent quantum dot-containing composition is used in at least a part of the sealing member for sealing the LED chip, it is preferable for the sealing member 16 to have a thickness of 0.01 mm or more and less than 0.4 mm. It is not preferable that the thickness of the sealing member 16 be more than 0.4 mm, because in this case the wire connected to the leading electrode 12 may, depending on the depth of the recess of the cup 14, be subjected to an excessive load when the sealing member 16 is secured within the recess of the cup 14. If the thickness of the sealing member 16 is less than 0.01 mm when the fluorescent quantum dot-containing composition is used in at least a part of the sealing member for sealing the LED chip, the sealing member fails to function satisfactorily as a fluorescent material-containing sealing member.

When the fluorescent quantum dots 18 are not dispersed in the sealing member 16, it is preferable to provide the lens-shaped resin 20 (resin lens 20) formed of the fluorescent quantum dot-dispersed resin shaped product.

Figure 3:
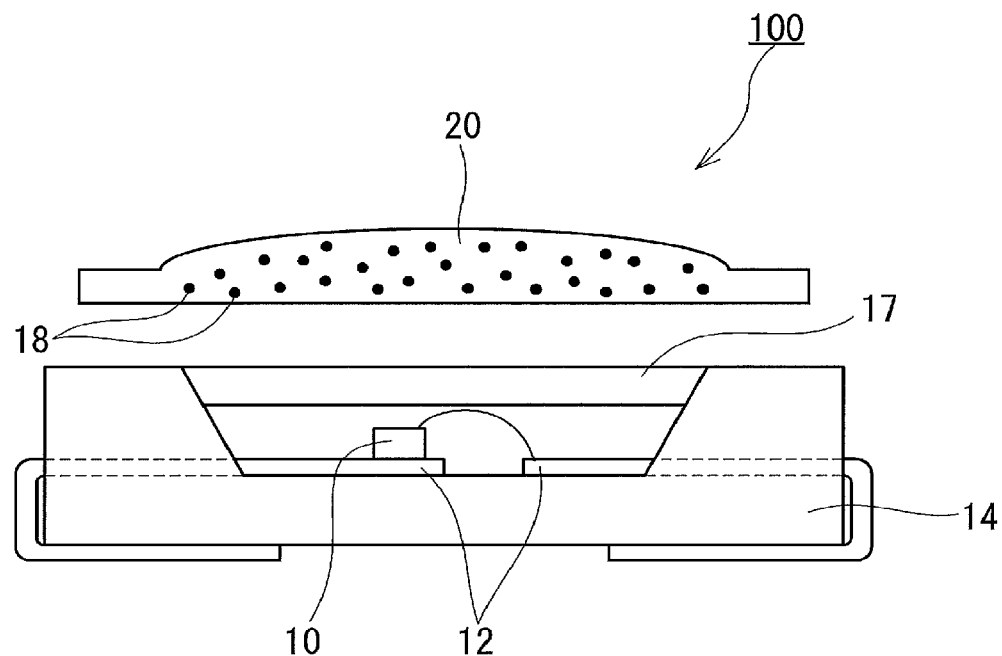
FIG. 3 is a cross-sectional view showing an exemplary light-emitting device in which a fluorescent quantum dot-dispersed resin shaped product according to the first embodiment of the present invention is used.

FIG. 3 shows a cross-sectional view of an exemplary light-emitting device in which a fluorescent quantum dot-dispersed resin shaped product according to the first embodiment is used. The light-emitting device of FIG. 3 is an example where the fluorescent quantum dot-containing composition according to the first embodiment is not used in any sealing member. In this case, the lens-shaped resin (resin lens 20) is formed of a fluorescent quantum dot-dispersed resin shaped product obtained by shaping a composition prepared by dispersing the fluorescent quantum dots 18 in a cycloolefin (co)polymer at a concentration of 0.01 to 20 wt %.

Figure 4:
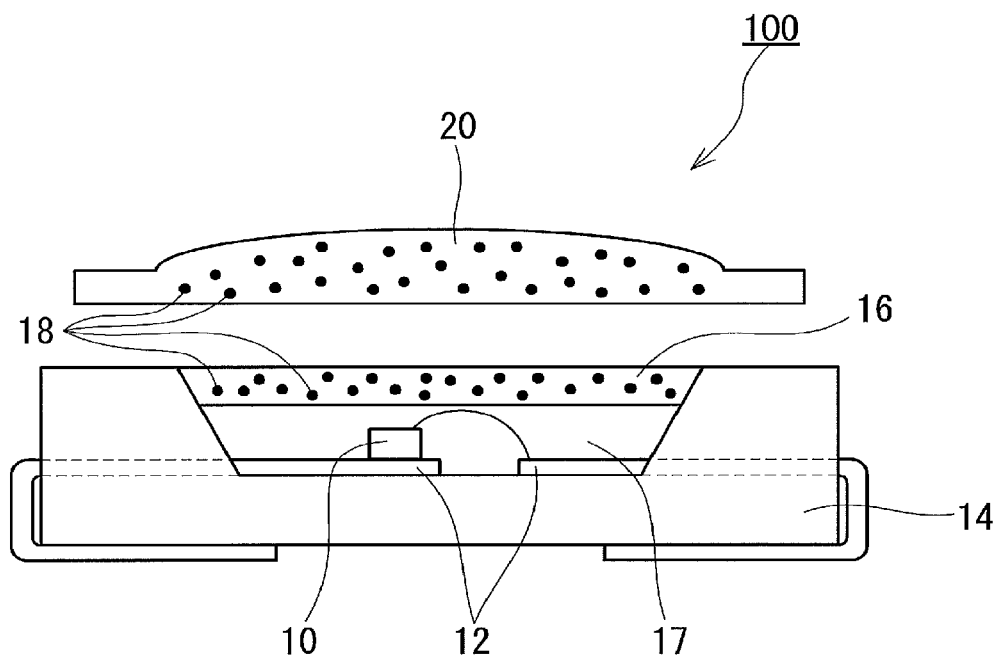
FIG. 4 is a cross-sectional view showing an exemplary light-emitting device in which a fluorescent quantum dot-containing composition and fluorescent quantum dot-dispersed resin shaped product according to the first embodiment of the present invention are used.

FIG. 4 shows a cross-sectional view of an exemplary light-emitting device in which a fluorescent quantum dot-containing composition and a fluorescent quantum dot-dispersed resin shaped product according to the first embodiment are used. The light-emitting device of FIG. 4 is an example where the fluorescent quantum dot-containing composition according to the first embodiment is used in a part of a sealing member, above which the resin lens 20 formed of the fluorescent quantum dot-dispersed resin shaped product is placed. Also in this example, both of the resin materials are formed by dispersing the fluorescent quantum dots 18 in a cycloolefin (co)polymer at a concentration of 0.01 to 20 wt %.

The light-emitting devices shown in FIGS. 2, 3, and 4 can reduce quenching of the fluorescent quantum dots and maintain stable operation as light-emitting devices. Hence, an electronic device such as a mobile phone, television, display, or panel having any of these light-emitting devices incorporated therein, and a machine such as an automobile, computer, or video game console having the electronic device incorporated therein, can be stably operated over a long time.

Second Embodiment

Figure 5:
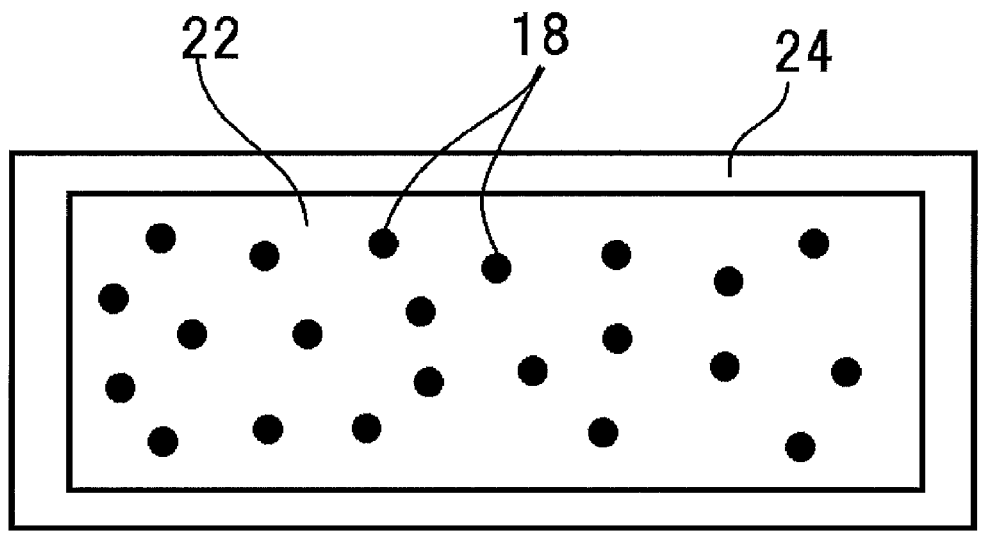
FIG. 5 is a cross-sectional view of an exemplary fluorescent quantum dot-containing structure according to the second embodiment of the present invention.

FIG. 5 shows a cross-sectional view of an exemplary fluorescent quantum dot-containing structure according to the second embodiment. In FIG. 5, the fluorescent quantum dot-containing structure includes: a fluorescent quantum dot-dispersed resin shaped product 22 containing a resin as a dispersion medium and fluorescent quantum dots 18 dispersed in the resin at a concentration of 0.01 to 20 wt %; and a gas barrier layer (protective sheet) 24 covering the entire surface of the fluorescent quantum dot-dispersed resin shaped product 22 to reduce transmission of gas such as oxygen into the fluorescent quantum dot-dispersed resin shaped product 22. In other embodiments, the gas barrier layer 24 may be designed to cover a part of the surface of the fluorescent quantum dot-dispersed resin shaped product 22 (see FIGS. 6 and 7). It is preferable for the gas barrier layer 24 to include the multilayer structure (W), because in this case the gas barrier layer 24 is capable of reducing transmission of not only oxygen but also water vapor.

The gas barrier layer 24 as defined herein refers to a layer capable of protecting the fluorescent quantum dots 18 from gas such as oxygen to such a degree that the spectral radiant energy of the fluorescent quantum dots 18 can be maintained at 80.0% or more of the initial value after a light-emitting diode (LED) is caused to emit light in the vicinity of the fluorescent quantum dot-containing structure for 2,000 consecutive hours. For the electronic device of the present invention, it is preferable that the spectral radiant energy of the fluorescent quantum dots 18 be 85.0% or more, more preferably 89.0% or more, even more preferably 90.0% or more, of the initial value after light emission for 2,000 consecutive hours. The spectral radiant energy is a radiant energy at the fluorescence wavelength of the fluorescent quantum dots. The spectral radiant energy can be measured, for example, using a quantum efficiency measurement system, QE-1000, manufactured by Otsuka Electronics Co., Ltd.

As the resin serving as a dispersion medium which is a constituent of the fluorescent quantum dot-dispersed resin shaped product 22 there can be used, for example, the cycloolefin (co)polymer described in the first embodiment. In addition, the method described in the first embodiment as a method for producing a fluorescent quantum dot-dispersed resin shaped product can be employed to produce the fluorescent quantum dot-dispersed resin shaped product 22.

Both the above fluorescent quantum dot-dispersed resin shaped product 22 and the multilayer structure (W) of the present invention constituting the gas barrier layer 24 are light-transmissive. Thus, light produced by a light-emitting diode can be transmitted to the fluorescent quantum dots 18, and wavelength-converted light resulting from conversion by the fluorescent quantum dots 18 can be transmitted to the outside of the fluorescent quantum dot-dispersed resin shaped product 22.

Figure 6:
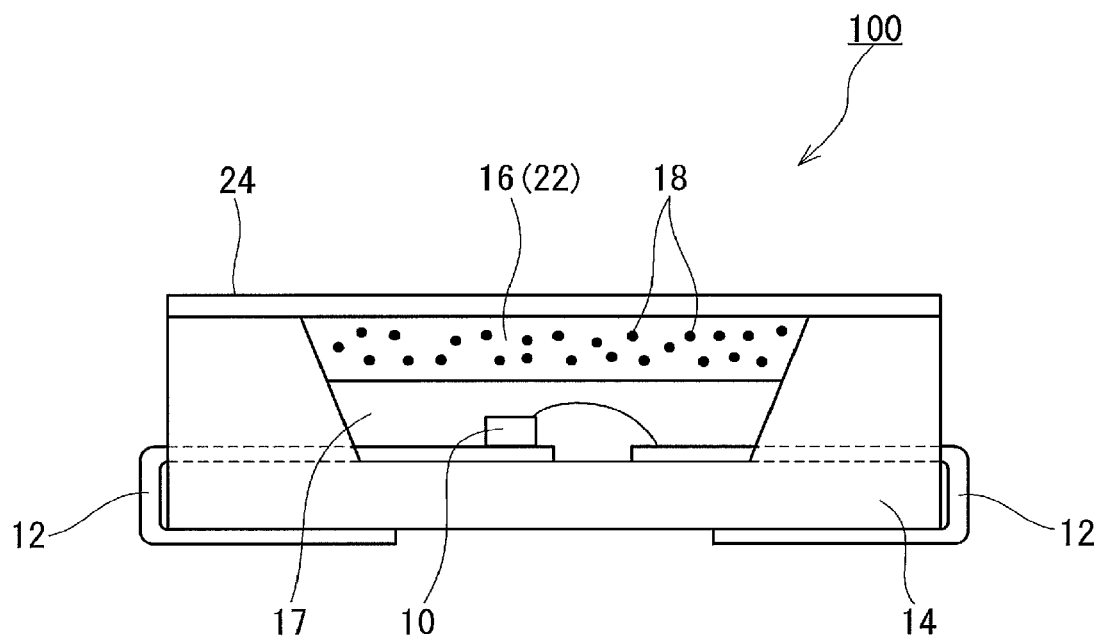
FIG. 6 is a cross-sectional view of an exemplary light-emitting device to which the fluorescent quantum dot-containing structure according to the second embodiment of the present invention is applied.

FIG. 6 shows a cross-sectional view of an exemplary light-emitting device to which the fluorescent quantum dot-containing structure according to the second embodiment is applied. In FIG. 6, the light-emitting device 100 includes an LED chip 10, a leading electrode 12, a cup 14, a sealing member 16 having fluorescent quantum dots 18 dispersed therein, a sealing member 17 having no fluorescent quantum dots 18 dispersed therein, and a gas barrier layer 24. In the example of FIG. 6, the gas barrier layer 24 is used as a lid for the cup 14. The sealing member 16 is composed of the fluorescent quantum dot-dispersed resin shaped product 22 formed from the fluorescent quantum dot-containing composition described in the first embodiment. The sealing member 16 and sealing member 17 may be identical to those of FIG. 1. Among these components, the fluorescent quantum dots 18, the fluorescent quantum dot-dispersed resin shaped product 22, and the gas barrier layer 24 are as previously described. The LED chip 10 is not limited to a particular one, and a light-emitting diode that cooperates with the fluorescent quantum dots to form a light source with a desired wavelength can be used. The cup 14 can be formed from an appropriate resin or ceramic. The sealing member 17 seals the LED chip 10, the leading electrode 12, etc.

Figure 7:
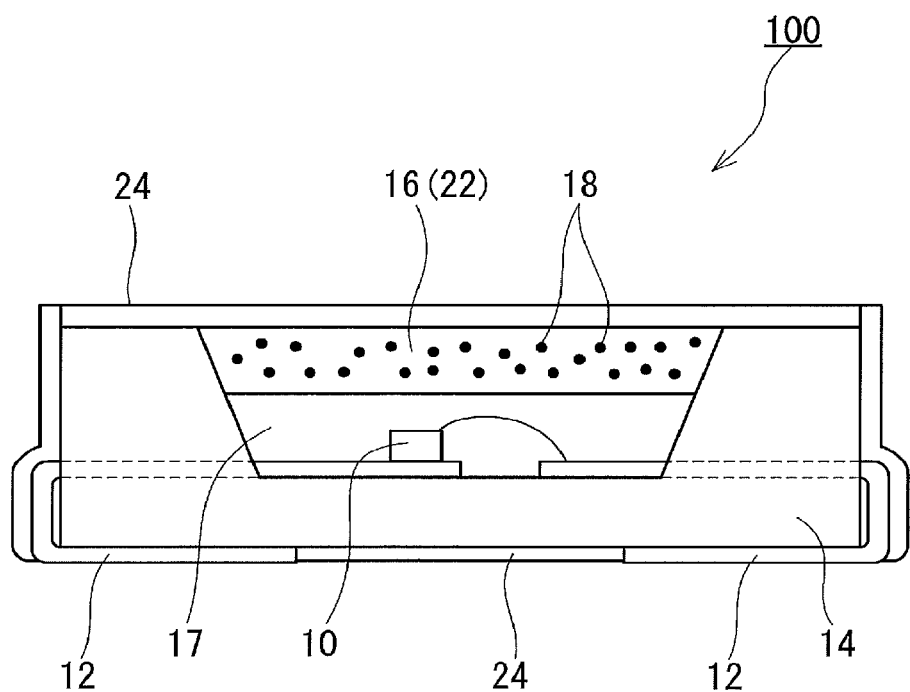
FIG. 7 is a cross-sectional view of another exemplary light-emitting device to which the fluorescent quantum dot-containing structure according to the second embodiment of the present invention is applied.

FIG. 7 shows a cross-sectional view of another exemplary light-emitting device to which the fluorescent quantum dot-containing structure according to the second embodiment is applied. The components identical to those of FIG. 6 are denoted by the same reference characters. In the example of FIG. 7, the gas barrier layer 24 covers the surface of the cup 14 (including the portion corresponding to a lid in FIG. 6) and the surface of that portion of the leading electrode 12 which lies outside the cup 14. A part of the surface of the leading electrode 12 is exposed without being covered by the gas barrier layer 24. This is in order to, for example, establish electrical conduction between the light-emitting device and the power-supply path on a mounting board. Also in this example, the gas barrier layer 24 covers the side of the sealing member 16 that corresponds to its upper surface as seen in the figure. This can eliminate or reduce the penetration of gas such as oxygen to the fluorescent quantum dots 18 dispersed in the sealing member 16. A portion of light from the LED chip 10 is converted to light of a different wavelength by the fluorescent quantum dots 18 dispersed in the sealing member 16, and then the converted light is mixed with light from the LED chip 10 and transmitted through the gas barrier layer 24 to the outside.

In the configuration shown in FIG. 6, the lid of the cup 14 is formed by the gas barrier layer 24 and covers the side of the sealing member 16 that corresponds to its upper surface as seen in the figure. This can eliminate or reduce the penetration of gas such as oxygen to the fluorescent quantum dots 18 dispersed in the sealing member 16.

The fluorescent quantum dot-dispersed resin composition, the shaped product thereof, and the fluorescent quantum dot-containing structure, which have been described above, are applicable, for example, to plant growth lighting, colored lighting, white lighting, light sources for LED backlights, fluorescent material-containing liquid crystal filters, fluorescent material-containing resin sheets, light sources for hair restoration devices, and light sources for communication devices.

[Multilayer Structure (W)]

The multilayer structure (W) used in the fluorescent quantum dot-containing electronic device of the present invention includes a base (X) and a layer (Y) containing aluminum. The layer (Y) contains a reaction product (D) of an aluminum-containing compound (A) (which hereinafter may be simply referred to as "compound (A)") and a phosphorus compound (B).

[Base (X)]

The material of the base (X) is not particularly limited, and a base made of any of various materials can be used. Examples of the material of the base (X) include: resins such as thermoplastic resins and thermosetting resins; wood; and glass. Among these, thermoplastic resins are preferred. The form of the base (X) is not particularly limited. The base (X) may be a laminar base such as a film or sheet. The base (X) preferably includes a thermoplastic resin film and is more preferably a thermoplastic resin film.

Examples of thermoplastic resins that may be used in the base (X) include: polyolefin resins such as polyethylene and polypropylene; polyester resins such as polyethylene terephthalate (PET), polyethylene-2,6-naphthalate, polybutylene terephthalate, and copolymers thereof, polyamide resins such as nylon-6, nylon-66, and nylon-12; hydroxy group-containing polymers such as polyvinyl alcohol and ethylene-vinyl alcohol copolymer; polystyrene; poly(meth) acrylic acid esters; polyacrylonitrile; polyvinyl acetate; polycarbonate; polyarylate; regenerated cellulose; polyimide; polyetherimide; polysulfone; polyethersulfone; polyetheretherketone; and ionomer resins. The material of the base (X) is preferably at least one thermoplastic resin selected from the group consisting of polyethylene, polypropylene, polyethylene terephthalate, nylon-6, and nylon-66.

When a film made of a thermoplastic resin is used as the base (X), the base (X) may be an oriented film or non-oriented film. In terms of high suitability for processes (such as printing and lamination) of the resulting multilayer structure, an oriented film, particularly a biaxially-oriented film, is preferred. The biaxially-oriented film may be a biaxially-oriented film produced by any one method selected from simultaneous biaxial stretching, sequential biaxial stretching, and tubular stretching.

When the base (X) is in the form of a layer, the thickness of the base (X) is preferably 1 to 1,000 μm, more preferably 5 to 500 μm, and even more preferably 9 to 200 μm, in terms of high mechanical strength and good processability of the resulting multilayer structure.

[Layer (Y)]

The layer (Y) contains the reaction product (D) of the compound (A) and the phosphorus compound (B). The compound (A) is an aluminum-containing compound. The phosphorus compound (B) has a functional group containing a phosphorus atom. The phosphorus compound (B) includes an inorganic phosphorus compound (BI) and/or organic phosphorus compound (BO). The compound (A) and the phosphorus compound (B) will now be described.

[Compound (A)]

The compound (A) is preferably an aluminum-containing metal oxide (Aa) (which hereinafter may be simply referred to as "metal oxide (Aa)").

[Aluminum-Containing Metal Oxide (Aa)]

The aluminum-containing metal oxide (Aa) is typically in the form of particles when reacted with the phosphorus compound (B) (preferably the inorganic phosphorus compound (BI)).

The metal atoms constituting the aluminum-containing metal oxide (Aa) (the metal atoms may be collectively referred to as "metal atoms (M)") include at least one metal atom selected from atoms of metals belonging to Groups 2 to 14 of the periodic table, and include at least aluminum atoms. The metal atoms (M) may consist only of aluminum atoms or may include aluminum atoms and other metal atoms. A combination of two or more metal oxides (Aa) may be used as the metal oxide (Aa).

The proportion of aluminum atoms in the metal atoms (M) is typically 50 mol % or more, and may be 60 mol % to 100 mol % or 80 mol % to 100 mol %. Examples of the metal oxide (Aa) include metal oxides produced by methods such as liquid-phase synthesis, gas-phase synthesis, and solid grinding.

The metal oxide (Aa) may be a hydrolytic condensate of a compound (E) containing the metal atom (M) to which a hydrolyzable characteristic group is bonded. Examples of the characteristic group include $R^1$ in the general formula [I] described below. The hydrolytic condensate of the compound (E) can be regarded substantially as a metal oxide. Thus, the hydrolytic condensate of the compound (E) may be referred to as "metal oxide (Aa)" herein. That is, the term "metal oxide (Aa)" as used herein is interchangeable with the term "hydrolytic condensate of the compound (E)", while the term "hydrolytic condensate of the compound (E)" as used herein is interchangeable with the term "metal oxide (Aa)".

[Compound (E) Containing Metal Atom (M) to which Hydrolyzable Characteristic Group is Bonded]

In terms of ease of control of reaction with the inorganic phosphorus compound (BI) and in terms of good gas barrier properties of the resulting multilayer structure, the compound (E) preferably includes at least one compound (Ea) represented by the following general formula [I].

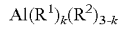
$$Al(R^1)_k(R^2)_{3-k} \qquad [I]$$

In this formula, $R^1$ is a halogen atom (such as a fluorine atom, chlorine atom, bromine atom, or iodine atom), $NO_3$, an optionally substituted alkoxy group having 1 to 9 carbon atoms, an optionally substituted acyloxy group having 2 to 9 carbon atoms, an optionally substituted alkenyloxy group having 3 to 9 carbon atoms, an optionally substituted ß-diketonato group having 5 to 15 carbon atoms, or a diacylmethyl group having an optionally substituted acyl group having 1 to 9 carbon atoms. $R^2$ is an optionally substituted alkyl group having 1 to 9 carbon atoms, an optionally substituted aralkyl group having 7 to 10 carbon atoms, an optionally substituted alkenyl group having 2 to 9 carbon atoms, or an optionally substituted aryl group having 6 to 10 carbon atoms. k is an integer of 1 to 3. When there are two or more atoms or groups represented by $R^1$, the atoms or groups represented by $R^1$ may be the same as or different from each other. When there are two or more atoms or groups represented by $R^2$, the atoms or groups represented by $R^2$ may be the same as or different from each other.

The compound (E) may include, in addition to the compound (Ea), at least one compound (Eb) represented by the following general formula [II].

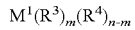
$$M^1(R^3)_m(R^4)_{n-m} \qquad [II]$$

In this formula, $M^1$ is at least one metal atom different from an aluminum atom and selected from atoms of metals belonging to Groups 2 to 14 of the periodic table. $R^3$ is a halogen atom (such as a fluorine atom, chlorine atom, bromine atom, or iodine atom), $NO_3$, an optionally substituted alkoxy group having 1 to 9 carbon atoms, an optionally substituted acyloxy group having 2 to 9 carbon atoms, an optionally substituted alkenyloxy group having 3 to 9 carbon atoms, an optionally substituted 6-diketonato group having 5 to 15 carbon atoms, or a diacylmethyl group having an optionally substituted acyl group having 1 to 9 carbon atoms. $R^4$ is an optionally substituted alkyl group having 1 to 9 carbon atoms, an optionally substituted aralkyl group having 7 to 10 carbon atoms, an optionally substituted alkenyl group having 2 to 9 carbon atoms, or an optionally substituted aryl group having 6 to 10 carbon atoms. m is an integer of 1 to n. n is equal to the valence of $M^1$. When there are two or more atoms or groups represented by $R^3$, the atoms or groups represented by $R^3$ may be the same as or different from each other. When there are two or more atoms or groups represented by $R^4$, the atoms or groups represented by $R^4$ may be the same as or different from each other.

Examples of the alkoxy groups represented by $R^1$ and $R^3$ include methoxy, ethoxy, n-propoxy, isopropoxy, n-butoxy, isobutoxy, sec-butoxy, tert-butoxy, benzyloxy, diphenylmethoxy, trityloxy, 4-methoxybenzyloxy, methoxymethoxy, 1-ethoxyethoxy, benzyloxymethoxy, 2-trimethylsilylethoxy, 2-trimethylsilylethoxymethoxy, phenoxy, and 4-methoxyphenoxy groups.

Examples of the acyloxy groups represented by $R^1$ and $R^3$ include acetoxy, ethylcarbonyloxy, n-propylcarbonyloxy, isopropylcarbonyloxy, n-butylcarbonyloxy, isobutylcarbonyloxy, sec-butylcarbonyloxy, tert-butylcarbonyloxy, and n-octylcarbonyloxy groups.

Examples of the alkenyloxy groups represented by $R^1$ and $R^3$ include allyloxy, 2-propenyloxy, 2-butenyloxy, 1-methyl-2-propenyloxy, 3-butenyloxy, 2-methyl-2-propenyloxy, 2-pentenyloxy, 3-pentenyloxy, 4-pentenyloxy, 1-methyl-3-butenyloxy, 1,2-dimethyl-2-propenyloxy, 1,1-dimethyl-2-propenyloxy, 2-methyl-2-butenyloxy, 3-methyl-2-butenyloxy, 2-methyl-3-butenyloxy, 3-methyl-3-butenyloxy, 1-vinyl-2-propenyloxy, and 5-hexenyloxy groups.

Examples of the ß-diketonato groups represented by $R^1$ and $R^3$ include 2,4-pentanedionato, 1,1,1-trifluoro-2,4-pentanedionato, 1,1,1,5,5,5-hexafluoro-2,4-pentanedionato, 2,2,6,6-tetramethyl-3,5-heptanedionato, 1,3-butanedionato, 2-methyl-1,3-butanedionato, 2-methyl-1,3-butanedionato, and benzoylacetonato groups.

Examples of the acyl groups of the diacylmethyl groups represented by $R^1$ and $R^3$ include: aliphatic acyl groups having 1 to 6 carbon atoms such as formyl, acetyl, propionyl (propanoyl), butyryl (butanoyl), valeryl (pentanoyl), and hexanoyl groups; and aromatic acyl (aroyl) groups such as benzoyl and toluoyl groups.

Examples of the alkyl groups represented by $R^2$ and $R^4$ include methyl, ethyl, n-propyl, isopropyl, n-butyl, isobutyl, sec-butyl, tert-butyl, n-pentyl, isopentyl, n-hexyl, isohexyl, 3-methylpentyl, 2-methylpentyl, 1,2-dimethylbutyl, cyclopropyl, cyclopentyl, and cyclohexyl groups.

Examples of the aralkyl groups represented by $R^2$ and $R^4$ include benzyl and phenylethyl (phenethyl) groups.

Examples of the alkenyl groups represented by $R^2$ and $R^4$ include vinyl, 1-propenyl, 2-propenyl, isopropenyl, 3-butenyl, 2-butenyl, 1-butenyl, 1-methyl-2-propenyl, 1-methyl-1-propenyl, 1-ethyl-1-ethenyl, 2-methyl-2-propenyl, 2-methyl-1-propenyl, 3-methyl-2-butenyl, and 4-pentenyl groups.

Examples of the aryl groups represented by $R^2$ and $R^4$ include phenyl, 1-naphthyl, and 2-naphthyl groups.

Examples of the substituents in $R^1$, $R^2$, $R^3$, and $R^4$ include: alkyl groups having 1 to 6 carbon atoms; alkoxy groups having 1 to 6 carbon atoms such as methoxy, ethoxy, n-propoxy, isopropoxy, n-butoxy, isobutoxy, sec-butoxy, tert-butoxy, n-pentyloxy, isopentyloxy, n-hexyloxy, cyclopropyloxy, cyclobutyloxy, cyclopentyloxy, and cyclohexyloxy groups; alkoxycarbonyl groups having 1 to 6 carbon atoms such as methoxycarbonyl, ethoxycarbonyl, n-propoxycarbonyl, isopropoxycarbonyl, n-butoxycarbonyl, isobutoxycarbonyl, sec-butoxycarbonyl, tert-butoxycarbonyl, n-pentyloxycarbonyl, isopentyloxycarbonyl, cyclopropyloxycarbonyl, cyclobutyloxycarbonyl, and cyclopentyloxycarbonyl groups; aromatic hydrocarbon groups such as phenyl, tolyl, and naphthyl groups; halogen atoms such as fluorine, chlorine, bromine, and iodine atoms; acyl groups having 1 to 6 carbon atoms; aralkyl groups having 7 to 10 carbon atoms; aralkyloxy groups having 7 to 10 carbon atoms; alkylamino groups having 1 to 6 carbon atoms; and dialkylamino groups having an alkyl group having 1 to 6 carbon atoms.

It is preferable for $R^1$ and $R^3$ to be a halogen atom, $NO_3$, an optionally substituted alkoxy group having 1 to 6 carbon atoms, an optionally substituted acyloxy group having 2 to 6 carbon atoms, an optionally substituted ß-diketonato group having 5 to 10 carbon atoms, or a diacylmethyl group having an optionally substituted acyl group having 1 to 6 carbon atoms, and it is more preferable for $R^1$ and $R^3$ to be an optionally substituted alkoxy group having 1 to 6 carbon atoms.

It is preferable for $R^2$ and $R^4$ to be an optionally substituted alkyl group having 1 to 6 carbon atoms. It is preferable for k in the formula [I] to be 3.

It is preferable for $M^1$ to be an atom of a metal belonging to Group 4 of the periodic table, and it is more preferable for $M^1$ to be titanium or zirconium. When $M^1$ is an atom of a metal belonging to Group 4 of the periodic table, m in the formula [II] is preferably 4.

Boron and silicon are categorized herein as metals, although they may be classified as semimetals in other contexts.

Examples of the compound (Ea) include aluminum chloride, aluminum nitrate, aluminum acetate, tris(2,4-pentanedionato)aluminum, trimethoxyaluminum, triethoxyaluminum, tri-n-propoxyaluminum, triisopropoxyaluminum, tri-n-butoxyaluminum, tri-sec-butoxyaluminum, and tri-tert-butoxyaluminum. Among these, triisopropoxyaluminum and tri-sec-butoxyaluminum are preferred. A combination of two or more compounds (Ea) may be used as the compound (E).

Examples of the compound (Eb) include: titanium compounds such as tetrakis(2,4-pentanedionato)titanium, tetramethoxytitanium, tetraethoxytitanium, tetraisopropoxytitanium, tetra-n-butoxytitanium, and tetrakis(2-ethylhexoxy)titanium; and zirconium compounds such as tetrakis(2,4-pentanedionato)zirconium, tetra-n-propoxyzirconium, and tetra-n-butoxyzirconium. These may be used alone, or a combination of two or more thereof may be used as the compound (Eb).

The proportion of the compound (Ea) in the total amount of the compound (E) is not particularly limited as long as the effect of the present invention is obtained. For example, the proportion of the compound (e.g., the compound (Eb)) other than the compound (Ea) in the total amount of the compound (E) is preferably 20 mol % or less, more preferably 10 mol % or less, and even more preferably 5 mol % or less, and may be 0 mol %.

The compound (E) is hydrolyzed, so that at least some of the hydrolyzable characteristic groups of the compound (E) are converted to hydroxy groups. The hydrolysate is then condensed to form a compound in which the metal atoms (M) are linked together via an oxygen atom (O). The repetition of this condensation results in the formation of a compound that can be regarded substantially as a metal oxide. The thus formed metal oxide (Aa), in general, has hydroxy groups present on its surface.

A compound is categorized herein as the metal oxide (Aa) when the ratio, [the number of moles of the oxygen atoms (O) bonded only to the metal atoms (M)]/[the number of moles of the metal atoms (M)], is 0.8 or more in the compound. The "oxygen atom (O) bonded only to the metal atom (M)", as defined herein, refers to the oxygen atom (O) in the structure represented by M-O-M, and does not include an oxygen atom that is bonded to both the metal atom (M) and hydrogen atom (H) as is the case for the oxygen atom (O) in the structure represented by M-O—H. The above ratio in the metal oxide (Aa) is preferably 0.9 or more, more preferably 1.0 or more, and even more preferably 1.1 or more. The upper limit of this ratio is not particularly defined. When the valence of the metal atom (M) is denoted by n, the upper limit is typically expressed as n/2.

In order for the hydrolytic condensation to take place, it is important that the compound (E) has hydrolyzable characteristic groups. When there are no such groups bonded, hydrolytic condensation reaction does not occur or proceeds very slowly, which makes difficult the preparation of the metal oxide (Aa) intended.

The hydrolytic condensate of the compound (E) may be produced, for example, from a particular starting material by a technique employed in known sol-gel processes. As the starting material there can be used at least one selected from the group consisting of the compound (E), a partial hydrolysate of the compound (E), a complete hydrolysate of the compound (E), a compound formed by partial hydrolytic condensation of the compound (E), and a compound formed by condensation of a part of a complete hydrolysate of the compound (E).

The metal oxide (Aa) to be mixed with an inorganic phosphorus compound (BI)-containing material (the inorganic phosphorus compound (BI) itself or a composition containing the inorganic phosphorus compound (BI)) is preferably substantially free of phosphorus atoms.

[Phosphorus Compound (B)]

The phosphorus compound (B) has a functional group containing a phosphorus atom. The phosphorus compound (B) includes the inorganic phosphorus compound (BI) and/or organic phosphorus compound (BO), and is preferably the inorganic phosphorus compound (BI).

[Inorganic Phosphorus Compound (BI)]

The inorganic phosphorus compound (BI) has a moiety capable of reacting with the metal oxide (Aa) and typically has two or more such moieties. It is preferable for the inorganic phosphorus compound (BI) to be a compound having 2 to 20 such moieties (atomic groups or functional groups). Examples of such moieties include a moiety capable of undergoing a condensation reaction with a functional group (e.g., hydroxy group) present on the surface of the metal oxide (Aa). Examples of such a moiety include a halogen atom bonded directly to a phosphorus atom and an oxygen atom bonded directly to a phosphorus atom. In general, the functional group (e.g., hydroxy group) present on the surface of the metal oxide (Aa) is bonded to the metal atom (M) constituting the metal oxide (Aa).

Examples of the inorganic phosphorus compound (BI) include: phosphorus oxoacids such as phosphoric acid, diphosphoric acid, triphosphoric acid, polyphosphoric acid formed by condensation of 4 or more molecules of phosphoric acid, phosphorous acid, phosphonic acid, phosphonous acid, phosphinic acid, and phosphinous acid; salts of these oxoacids (e.g., sodium phosphate); and derivatives of these oxoacids (e.g., halides such as phosphoryl chloride and dehydration products such as phosphorus pentoxide).

These inorganic phosphorus compounds (BI) may be used alone or in combination with one another. Among these inorganic phosphorus compounds (BI), phosphoric acid is preferably used alone or in combination with another inorganic phosphorus compound (BI). The use of phosphoric acid improves the stability of the coating liquid (S) described later and the gas barrier properties of the resulting multilayer structure (W). When phosphoric acid is used in combination with another inorganic phosphorus compound (BI), phosphoric acid preferably makes up 50 mol % or more of the total inorganic phosphorus compounds (BI).

[Organic Phosphorus Compound (BO)]

Examples of the phosphorus atom-containing functional group in the organic phosphorus compound (BO) include a phosphoric acid group, a phosphorous acid group, a phosphonic acid group, a phosphonous acid group, a phosphinic acid group, a phosphinous acid group, and functional groups derived from these groups (e.g., salts, (partial) esters, halides (such as chloride), and dehydration products). Among these, a phosphoric acid group and a phosphonic acid group are preferred, and a phosphonic acid group is more preferred.

It is preferable for the organic phosphorus compound (BO) to be a polymer (BOa) having the phosphorus atom-containing functional group. Examples of the polymer (BOa) include: polymers of phosphono(meth)acrylic acid esters such as 6-[(2-phosphonoacetyl)oxy]hexyl acrylate, 2-phosphonooxyethyl methacrylate, phosphonomethyl methacrylate, 11-phosphonoundecyl methacrylate, and 1,1-diphosphonoethyl methacrylate; polymers of vinylphosphonic acids such as vinylphosphonic acid, 2-propene-1-phosphonic acid, 4-vinylbenzylphosphonic acid, and 4-vinylphenylphosphonic acid; polymers of vinylphosphinic acids such as vinylphosphinic acid and 4-vinylbenzylphosphinic acid; and phosphorylated starch. The polymer (BOa) may be a homopolymer of a monomer having at least one phosphorus atom-containing functional group or may be a copolymer of two or more monomers. Alternatively, a combination of two or more polymers each formed from a single monomer may be used as the polymer (BOa). In particular, a polymer of a phosphono(meth)acrylic acid ester and a polymer of a vinylphosphonic acid are preferred, and a polymer of a vinylphosphonic acid is more preferred. That is, poly(vinylphosphonic acid) is preferred as the polymer (BOa). The polymer (BOa) can be obtained also by homopolymerization or copolymerization of a vinylphosphonic acid derivative such as a vinylphosphonic acid halide or vinylphosphonic acid ester, followed by hydrolysis.

Alternatively, the polymer (BOa) may be a copolymer of a monomer having at least one phosphorus atom-containing functional group and another vinyl monomer. Examples of the other vinyl monomer copolymerizable with the monomer having the phosphorus atom-containing functional group include (meth)acrylic acid, (meth)acrylic acid esters, (meth)acrylonitrile, styrene, nuclear-substituted styrenes, alkyl vinyl ethers, alkyl vinyl esters, perfluoroalkyl vinyl ethers, perfluoroalkyl vinyl esters, maleic acid, maleic anhydride, fumaric acid, itaconic acid, maleimide, and phenylmaleimide. Among these, (meth)acrylic acid esters, acrylonitrile, styrene, maleimide, and phenylmaleimide are preferred.

In order to obtain a multilayer structure that has better bending resistance, the proportion of the structural units derived from the monomer having the phosphorus atom-containing functional group in the total structural units of the polymer (BOa) is preferably 10 mol % or more, more preferably 20 mol % or more, even more preferably 40 mol % or more, and particularly preferably 70 mol % or more, and may be 100 mol %.

The molecular weight of the polymer (BOa) is not particularly limited, but is preferably such that the number-average molecular weight is in the range of 1,000 to 100,000. When the number-average molecular weight is in this range, both a high level of improving effect of stacking of the layer (Y) on bending resistance and a high level of viscosity stability of a coating liquid (T) described later can be achieved.

When the layer (Y) of the multilayer structure (W) contains the inorganic phosphorus compound (BI), the ratio $W_{BO}/W_{BI}$ between the weight $W_{BI}$ of the inorganic phosphorus compound (BI) and the weight $W_{BO}$ of the organic phosphorus compound (BO) in the layer (Y) preferably satisfies a relationship of $0.01/99.99 \leq W_{BO}/W_{BI} < 6.00/94.00$. In terms of good barrier performance, the ratio $W_{BO}/W_{BI}$ more preferably satisfies a relationship of $0.10/99.90 \leq W_{BO}/W_{BI} < 4.50/95.50$, even more preferably satisfies a relationship of $0.20/99.80 \leq W_{BO}/W_{BI} < 4.00/96.00$, and particularly preferably satisfies a relationship of $0.50/99.50 \leq W_{BO}/W_{BI} < 3.50/96.50$. That is, it is preferable to use the compounds in such proportions that the proportion of $W_{BO}$ be low, in particular 0.01 or more and less than 6.00, while the proportion of $W_{BI}$ be high, in particular more than 94.00 and 99.99 or less. When the inorganic phosphorus compound (BI) and/or organic phosphorus compound (BO) has undergone a reaction in the layer (Y), a moiety derived from the inorganic phosphorus compound (BI) and/or organic phosphorus compound (BO) in the reaction product is regarded as the inorganic phosphorus compound (BI) and/or organic phosphorus compound (BO). In this case, the weight of the inorganic phosphorus compound (BI) and/or organic phosphorus compound (BO) used in the formation of the reaction product (the weight of the inorganic phosphorus compound (BI) and/or organic phosphorus compound (BO) that has yet to undergo the reaction) is included in the weight of the inorganic phosphorus compound (BI) and/or organic phosphorus compound (BO) in the layer (Y).

[Reaction Product (D)]

The reaction product (D) is formed by a reaction between the aluminum-containing compound (A) and the phosphorus compound (S). A compound formed by a reaction among the aluminum-containing compound (A), the phosphorus compound (B), and another compound is also categorized as the reaction product (D). The reaction product (D) is preferably a reaction product (Da) formed by a reaction between the aluminum-containing metal oxide (Aa) and the phosphorus compound (B), a reaction product (Db) formed by a reaction between the aluminum-containing compound (A) and the inorganic phosphorus compound (BI), or a reaction product (Dc) formed by a reaction between the aluminum-containing metal oxide (Aa) and the inorganic phosphorus compound (BI). More preferred is the reaction product (Dc) formed by a reaction between the aluminum-containing metal oxide (Aa) and the inorganic phosphorus compound (BI).

In an infrared absorption spectrum of the layer (Y), a maximum absorption wavenumber in the region from 800 to 1,400 $cm^{-1}$ is preferably 1,080 to 1,130 $cm^{-1}$. In the process in which the metal oxide (Aa) and the inorganic phosphorus compound (BI) react to form the reaction product (D), a metal atom (M) derived from the metal oxide (Aa) and a phosphorus atom (P) derived from the inorganic phosphorus compound (BI) are linked via an oxygen atom (O) to form a bond represented by M-O—P. As a result, a characteristic absorption band attributed to this bond appears in an infrared absorption spectrum of the reaction product (D). A study by the present inventors has revealed that the resulting multilayer structure exhibits good gas barrier properties when the characteristic absorption band attributed to the M-O—P bond is observed in the region from 1,080 to 1,130 cm$^{-1}$. It has been found that the resulting multilayer structure exhibits much better gas barrier properties particularly when the characteristic absorption band corresponds to the strongest absorption in the region from 800 to 1,400 cm$^{-1}$ where absorptions attributed to bonds between various atoms and oxygen atoms are generally observed.

By contrast, if a metal compound such as a metal alkoxide or metal salt and the inorganic phosphorus compound (BI) are first mixed together and the mixture is then subjected to hydrolytic condensation, the resulting product is a composite material in which the metal atoms derived from the metal compound and the phosphorus atoms derived from the inorganic phosphorus compound (BI) have been almost homogeneously mixed and reacted. In this case, in an infrared absorption spectrum of the composite material, the maximum absorption wavenumber in the region from 800 to 1,400 cm$^{-1}$ falls outside the range of 1,080 to 1,130 cm$^{-1}$.

In the infrared absorption spectrum of the layer (Y), the width at half maximum of the maximum absorption band in the region from 800 to 1,400 cm$^{-1}$ is preferably 200 cm$^{-1}$ or less, more preferably 150 cm$^{-1}$ or less, even more preferably 100 cm$^{-1}$ or less, and particularly preferably 50 cm$^{-1}$ or less, in terms of the gas barrier properties of the resulting multilayer structure.

The infrared absorption spectrum of the layer (Y) can be measured by the method described in "EXAMPLES" below. If the measurement is not possible by the method described in "EXAMPLES", the measurement may be conducted by another method, examples of which include, but are not limited to: reflection spectroscopy such as reflection absorption spectroscopy, external reflection spectroscopy, or attenuated total reflection spectroscopy; and transmission spectroscopy such as Nujol method or pellet method performed on the layer (Y) scraped from the multilayer structure.

The layer (Y) may partially contain the metal oxide (Aa) and/or inorganic phosphorus compound (BI) that remains uninvolved in any reaction.

In the layer (Y), the molar ratio between the metal atoms constituting the metal oxide (Aa) and the phosphorus atoms derived from the inorganic phosphorus compound (BI), as expressed by [Metal atoms constituting metal oxide (Aa)]:[Phosphorus atoms derived from inorganic phosphorus compound (BI)], is preferably 1.0:1.0 to 3.6:1.0 and more preferably 1.1:1.0 to 3.0:1.0. If the molar ratio falls outside such a range, the gas barrier performance deteriorates. The molar ratio in the layer (Y) can be controlled by adjusting the mixing ratio between the metal oxide (Aa) and the inorganic phosphorus compound (BI) in a coating liquid for forming the layer (Y). The molar ratio in the layer (Y) is typically equal to that in the coating liquid.

The reaction product (D) has an average particle diameter of 5 nm or more and 50 nm or less. The upper limit of the average particle diameter is preferably 40 nm or less and even more preferably 35 nm or less. The lower limit of the average particle diameter is preferably 15 nm or more and more preferably 20 nm or more. The average particle diameter of the reaction product (D) is more preferably 15 nm or more and 40 nm or less and even more preferably 20 nm or more and 35 nm or less. If the particle diameter is less than 5 nm, the barrier performance may deteriorate after damp heating. If the particle diameter is more than 50 nm, sufficient barrier performance cannot be achieved, and the total light transmittance or haze value is decreased. The method for measuring the average particle diameter of the reaction product (D) is as described in "EXAMPLES" below.

The average particle diameter of the reaction product (D) can be controlled by adjusting, or appropriately combining, the concentration of a solution used for reaction, the viscosity of a coating liquid, the temperature conditions (such as reaction temperature, drying temperature, and heat treatment temperature), and the mixing ratio between the compound (A) and the phosphorus compound (B) (such as the molar ratio between aluminum atoms and phosphorus atoms).

The average particle diameter of a reaction product (D) precursor in a precursor layer of the layer (Y) is preferably less than 5 nm and, in terms of achieving good barrier performance even after retorting under harsh conditions, is more preferably less than 4 nm and even more preferably less than 3 nm. When the average particle diameter of the reaction product (D) precursor in the dried precursor layer of the layer (Y) is in the above range, the average particle diameter of the reaction product (D) in the resulting layer (Y) is small so that better barrier performance is achieved. The lower limit of the average particle diameter of the reaction product (D) precursor is not particularly defined. The average particle diameter may be, for example, 0.1 nm or more or may be 1 nm or more. The method for measuring the average particle diameter of the reaction product (D) precursor is as described in "EXAMPLES" below.

[Layer (Z)]

The multilayer structure (W) may further include a layer (Z). The layer (Z) contains the polymer (BOa) having a phosphorus atom-containing functional group. The layer (Z) is preferably disposed contiguous to the layer (Y). That is, the layer (Z) and the layer (Y) are preferably arranged in contact with each other. It is also preferable for the layer (Z) to be disposed opposite to the base (X) across the layer (Y) (preferably on one surface of the layer (Y) opposite to that facing the base (X)). In other words, the base (X), the layer (Y), and the layer (Z) are preferably arranged in this order. In a preferred example, the layer (Z) is disposed contiguous to the layer (Y) and opposite to the base (X) across the layer (Y) (preferably on one surface of the layer (Y) opposite to that facing the base (X)). The layer (Z) may further contain a polymer (F) having at least one functional group selected from the group consisting of a carbonyl group, a hydroxy group, a carboxyl group, a carboxylic anhydride group, and a salt of a carboxyl group. The type, amount, etc. of the polymer (BOa) to be used in the layer (Z) can be identical to those of the polymer (BOa) that may be contained in the layer (Y).

The layer (Z) may consist only of the polymer (BOa), may consist only of the polymer (BOa) and the polymer (F), or may further contain an additional component. Examples of the additional component that may be contained in the layer (Z) include: metal salts of inorganic acids such as a metal carbonate, a metal hydrochloride, a metal nitrate, a metal hydrogen carbonate, a metal sulfate, a metal hydrogen sulfate, and a metal borate; metal salts of organic acids such as a metal acetate, a metal stearate, a metal oxalate, and a metal tartrate; metal complexes such as a cyclopentadienyl metal complex (e.g., titanocene) and a cyanometal complex (e.g., Prussian blue); layered clay compounds; crosslinkers; a polymer compound other than the polymer (BOO and polymer (F); plasticizers; antioxidants; ultraviolet absorbers; and flame retardants. The content of the additional component in the layer (Z) is preferably 50 wt % or less, more preferably 20 wt % or less, even more preferably 10 wt % or less, and particularly preferably 5 wt % or less, and may be 0 wt % (which means that the additional component is not contained). The layer (Z) does not contain at least one selected from the aluminum-containing compound (A), the phosphorus compound (B), and the reaction product (D) of the aluminum-containing compound (A) and the phosphorus compound (B). The layer (Z) typically does not contain the metal oxide (Aa).

[Inorganic Deposited Layer, Compound (Ac), and Compound (Ad)]

The multilayer structure (W) may further include an inorganic deposited layer. The inorganic deposited layer can be formed by vapor deposition of an inorganic substance. Examples of the inorganic substance include metals (such as aluminum), metal oxides (such as silicon oxide and aluminum oxide), metal nitrides (such as silicon nitride), metal oxynitrides (such as silicon oxynitride), and metal carbonitrides (such as silicon carbonitride). Among these, aluminum oxide, silicon oxide, magnesium oxide, and silicon nitride are preferred, since an inorganic deposited layer formed of any of these substances has good barrier properties against oxygen or water vapor. The layer (Y) in the multilayer structure (W) of the present invention may include an inorganic deposited layer containing aluminum. For example, the layer (Y) may include a deposited layer of aluminum (Ac) and/or a deposited layer of aluminum oxide (Ad).

The method for forming the inorganic deposited layer is not particularly limited, and available methods include: physical vapor deposition processes such as vacuum vapor deposition (e.g., resistive heating vapor deposition, electron beam vapor deposition, and molecular beam epitaxy), sputtering, and ion plating; and chemical vapor deposition processes such as thermal chemical vapor deposition (e.g., catalytic chemical vapor deposition), photochemical vapor deposition, plasma chemical vapor deposition (e.g., capacitively coupled plasma process, inductively coupled plasma process, surface wave plasma process, electron cyclotron resonance plasma process, and dual magnetron process), atomic layer deposition, and organometallic vapor deposition.

The thickness of the inorganic deposited layer is preferably 0.002 to 0.5 μm, more preferably 0.005 to 0.2 μm, and even more preferably 0.01 to 0.1 μm, although the specific preferred thickness depends on the type of the component of the inorganic deposited layer. A thickness at which good barrier properties or mechanical properties of the multilayer structure are achieved can be selected within the above range. If the thickness of the inorganic deposited layer is less than 0.002 μm, the inorganic deposited layer tends to have a low ability to repeatedly exhibit the barrier properties against oxygen or water vapor, and the inorganic deposited layer may fail to exhibit sufficient barrier properties. If the thickness of the inorganic deposited layer is more than 0.5 μm, the barrier properties of the inorganic deposited layer are likely to deteriorate when the multilayer structure is pulled or bent.

The layer (Y) included in the multilayer structure (W) may consist only of the reaction product (D) of the aluminum-containing compound (A) and the phosphorus compound (B), may consist only of the reaction product (Da) of the aluminum-containing metal oxide (Aa) and the phosphorus compound (B), may consist only of the reaction product (Db) of the aluminum-containing compound (A) and the inorganic phosphorus compound (BI), or may consist only of the reaction product (Dc) of the aluminum-containing metal oxide (Aa) and the inorganic phosphorus compound (BI). In all of the above aspects, the layer (Y) may further contain an additional component. Examples of the additional component include: metal salts of inorganic acids such as a metal carbonate, a metal hydrochloride, a metal nitrate, a metal hydrogen carbonate, a metal sulfate, a metal hydrogen sulfate, and a metal borate; metal salts of organic acids such as a metal oxalate, a metal acetate, a metal tartrate, and a metal stearate; metal complexes such as a cyclopentadienyl metal complex (e.g., titanocene) and a cyanometal complex (e.g., Prussian blue); layered clay compounds; crosslinkers; a polymer (F) other than the organic phosphorus compound (BO); plasticizers; antioxidants; ultraviolet absorbers; and flame retardants. The content of the additional component in the layer (Y) of the multilayer structure is preferably 50 wt % or less, more preferably 20 wt % or less, even more preferably 10 wt % or less, and particularly preferably 5 wt % or less, and may be 0 wt % (which means that the additional component is not contained).

[Polymer (F)]

The polymer (F) may be, for example, a polymer (Fa) having at least one functional group selected from the group consisting of an ether bond, a carbonyl group, a hydroxy group, a carboxyl group, a carboxylic anhydride group, and a salt of a carboxyl group.

Examples of the polymer (Fa) include: polyalkylene glycol polymers having an alkylene group having 2 to 4 carbon atoms such as polyethylene glycol, polyethylene oxide, polypropylene glycol, polypropylene oxide, polyoxyethylene polyoxypropylene glycol, and polytetramethylene ether glycol; polyketone; polyvinyl alcohol polymers such as polyvinyl alcohol, modified polyvinyl alcohol containing 1 to 50 mol % of α-olefin units having 4 or less carbon atoms, and polyvinyl acetal (e.g., polyvinyl butyral); polysaccharides such as cellulose, starch, and cyclodextrin; (meth) acrylic polymers such as polyhydroxyethyl (meth)acrylate, poly(meth)acrylic acid, and ethylene-acrylic acid copolymer; and maleic polymers such as a hydrolysate of ethylene-maleic anhydride copolymer, a hydrolysate of styrene-maleic anhydride copolymer, and a hydrolysate of isobutylene-maleic anhydride alternating copolymer. To allow the layer (Y) to have high transparency, it is preferable not to incorporate any polyvinyl alcohol polymer.

The polymer (Fa) may be a homopolymer of a monomer having a polymerizable group (e.g., vinyl acetate or acrylic acid), may be a copolymer of two or more monomers, or may be a copolymer of a monomer having a hydroxy group and/or carboxyl group and a monomer having none of these groups. A combination of two or more polymers (Fa) may be used as the polymer (Fa).

The molecular weight of the polymer (Fa) is not particularly limited. In order to obtain a multilayer structure that has better gas barrier properties and higher mechanical strength, the weight-average molecular weight of the polymer (Fa) is preferably 5,000 or more, more preferably 8,000 or more, and even more preferably 10,000 or more. The upper limit of the weight-average molecular weight of the polymer (Fa) is not particularly defined, and the weight-average molecular weight is, for example, 1,500,000 or less.

In terms of allowing the multilayer structure to have good appearance, the content of the polymer (Fa) in the layer (Y) is preferably 85 wt % or less, more preferably 50 wt % or less, even more preferably 20 wt % or less, and particularly preferably 10 wt % or less, with respect to the weight of the layer (Y) (defined as 100 wt %). The polymer (Fa) may or may not react with another component in the layer (Y).

The thickness of the layer (Y) (or, for a multilayer structure (W) including two or more layers (Y), the total thickness of the layers (Y)), is preferably 0.05 to 4.0 µm and more preferably 0.1 to 2.0 urn. Thinning the layer (Y) provides a reduction in the dimensional change of the multilayer structure during a process such as printing or lamination. Thinning the layer (Y) also provides an increase in the flexibility of the multilayer structure, thus making it possible to allow the multilayer structure to have mechanical characteristics close to mechanical characteristics intrinsic to the base. When the multilayer structure (W) includes two or more layers (Y), the thickness of each layer (Y) is preferably 0.05 µm or more in terms of gas barrier properties. The thickness of the layer (Y) can be controlled depending on the concentration of the later-described coating liquid (S) used for formation of the layer (Y) or the method for applying the liquid (S).

The thickness of the layer (Y) can be measured by observing a cross-section of the multilayer structure (W) with a scanning electron microscope or transmission electron microscope.

[Method for Producing Multilayer Structure (W)]

The features described for the multilayer structure (W) can be applied to the method for producing the multilayer structure (W) and may not be described repeatedly. The features described for the method for producing the multilayer structure (W) can be applied to the multilayer structure (W).

An example of the method for producing the multilayer structure (W) according to the present invention is a production method including the steps of: (I) applying a coating liquid (S) (first coating liquid) containing an aluminum-containing compound (A), a phosphorus compound (B), and a solvent onto a base (X) to form a precursor layer of a layer (Y), the precursor layer containing a reaction product (D) precursor; and (II) heat-treating the precursor layer of the layer (Y) at a temperature of 140° C. or higher to form the layer (Y) containing a reaction product (D). In the production method, the coating liquid (S) used in the step (I) may contain an organic phosphorus compound (BO). When the coating liquid (S) used in the step w does not contain the organic phosphorus compound (BO), the method may further include the step (I') of applying a coating liquid (T) containing the organic phosphorus compound (BO) to a surface of the layer (Y) obtained in the step (II). The compound (A), the inorganic phosphorus compound (BI), the organic phosphorus compound (BO), and the weight ratio between them are as previously described, and repeated explanation will be omitted in the following description of the production method.

[Step (I)]

In the step (I), the coating liquid (S) (first coating liquid) containing the aluminum-containing compound (A), the phosphorus compound (B), and a solvent is applied onto the base (X) to form a precursor layer of the layer (Y) on the base (X), the precursor layer containing a reaction product (D) precursor. The coating liquid (S) is obtained by mixing the aluminum-containing compound (A), the phosphorus compound (B), and the solvent. When the layer (Y) is to include a deposited layer of aluminum (Ac) or a deposited layer of aluminum oxide (Ad), the deposited layer can be formed by any of the common vapor deposition processes mentioned above. The following will describe a preferred embodiment employing the metal oxide (Aa), the inorganic phosphorus compound (BI), and the solvent.

In the preferred embodiment, the coating liquid (S) can be prepared by mixing the metal oxide (Aa) and the inorganic phosphorus compound (BI) in the solvent to cause a reaction. Specifically, the coating liquid (S) can be prepared, for example, by a method in which a dispersion of the metal oxide (Aa) and a solution containing the inorganic phosphorus compound (BI) are mixed or by a method in which the inorganic phosphorus compound (BI) is added to and mixed with a dispersion of the metal oxide (Aa). The temperature during the mixing is preferably 50° C. or lower, more preferably 30° C. or lower, and even more preferably 20° C. or lower. The coating liquid (S) may contain another compound (e.g., the polymer (F), preferably other than polyvinyl alcohol polymers), and may contain, if desired, at least one acid compound (Q) selected from the group consisting of acetic acid, hydrochloric acid, nitric acid, trifluoroacetic acid, and trichloroacetic acid.

The dispersion of the metal oxide (Aa) can be prepared, for example, by mixing the compound (E), water, and optionally an acid catalyst or organic solvent and allowing the compound (E) to undergo condensation or hydrolytic condensation according to procedures employed in known sol-gel processes. When the dispersion of the metal oxide (Aa) is obtained by condensation or hydrolytic condensation of the compound (E), the dispersion obtained may, if desired, be subjected to a certain process (such as deflocculation in the presence of the acid compound (Q)). The solvent used is preferably, but not limited to, an alcohol such as methanol, ethanol, or isopropanol, water, or a mixed solvent thereof.

The solution containing the inorganic phosphorus compound (BI) can be prepared by dissolving the inorganic phosphorus compound (BI) in a solvent. The solvent can be selected depending on the type of the inorganic phosphorus compound (BI), and preferably contains water. The solvent may contain an organic solvent (e.g., an alcohol such as methanol) as long as the organic solvent does not hinder the dissolution of the inorganic phosphorus compound (BI).

The solids concentration in the coating liquid (S) is preferably 1 to 20 wt %, more preferably 2 to 15 wt %, and even more preferably 3 to 10 wt %, in terms of the storage stability of the coating liquid and the quality of application of the coating liquid onto the base (X). The solids concentration can be determined, for example, by distilling off the solvent from the coating liquid (S) and dividing the weight of the remaining solids by the initial weight of the coating liquid (S) yet to be subjected to the distillation.

The viscosity of the coating liquid (S) is preferably 3,000 mPa·s or less, more preferably 2,500 mPa·s or less, and even more preferably 2,000 mPa·s or less, as measured with a Brookfield rotational viscometer (SB-type viscometer: rotor No. 3, rotational speed=60 rpm) at a temperature at which the coating liquid (S) is applied. Adjusting the viscosity to 3,000 mPa·s or less improves the leveling of the coating liquid (S), thus allowing the resulting multilayer structure to have better appearance. The viscosity of the coating liquid (S) is preferably 50 mPa·s or more, more preferably 100 mPa·s or more, and even more preferably 200 mPa·s or more.

To allow the reaction product (D) to have a predetermined average particle diameter, the molar ratio between aluminum atoms and phosphorus atoms in the coating liquid (S), as expressed by aluminum atoms:phosphorus atoms, is preferably 1.01:1.00 to 1.50:1.00 and more preferably 1.05:1.00 to 1.45:1.00. The molar ratio between aluminum atoms and phosphorus atoms can be determined by fluorescent X-ray analysis of a solid obtained by drying the coating liquid (S).

The coating liquid (S) may be applied directly onto at least one surface of the base (X) or applied onto the base (X) with an additional layer (J) interposed therebetween. An adhesive layer (G) may be formed on a surface of the base (X) by treating the surface of the base (X) with a known anchor coating agent or applying a known adhesive onto the surface of the base (X) before application of the coating liquid (S).

The method for application of the coating liquid (S) is not particularly limited, and any known method can be employed. Examples of the method for application include casting, dipping, roll coating, gravure coating, screen printing, reverse coating, spray coating, kiss coating, die coating, metering bar coating, chamber doctor-using coating, curtain coating, and bar coating.

In the step (I), the precursor layer of the layer (Y) is formed typically by removing the solvent from the coating liquid (S). The method for removing the solvent is not particularly limited, and any known drying method can be employed. Examples of the drying method include hot air drying, hot roll contact drying, infrared heating, and microwave heating. To allow the resulting multilayer structure to maintain good gas barrier properties after a damp heat test, it is important that, after drying, the solvent content and the average particle diameter of the reaction product (D) precursor are within predetermined ranges.

The solvent content of the dried precursor layer of the layer (Y) is 0.4 wt % or less and, in terms of achieving good barrier performance even after a damp heat test under harsh conditions, is preferably 0.3 wt % or less. If the solvent content is beyond the above limit after drying, the particle diameter of the reaction product (D) precursor to be subjected to the subsequent heat treatment (step (II)) is likely to be large. This may increase the average particle diameter of the reaction product (D) in the resulting layer (Y), leading to a failure to achieve sufficient barrier performance. The lower limit of the solvent content is not particularly defined. In general, it is preferable that the solvent content be 0.01 wt % or more, in terms of production cost. Methods available for measuring the solvent content include the methanol content measurement method and water content measurement method which will be described in "EXAMPLES" below.

The average particle diameter of the reaction product (D) precursor having undergone drying is less than 5 nm and, in terms of achieving good barrier performance even after a damp heat test under harsh conditions, is preferably less than 4 nm and more preferably less than 3 nm. If the average particle diameter of the reaction product (D) precursor having undergone drying is beyond the above limit, the average particle diameter of the reaction product (D) in the resulting layer (Y) may be increased so that sufficient barrier performance cannot be achieved. The lower limit of the average particle diameter of the reaction product (D) precursor is not particularly defined, and may be, for example, 0.1 nm or 1 nm. The method for measuring the average particle diameter of the reaction product (D) precursor is as described in "EXAMPLES" below.

In an infrared absorption spectrum of the layer (Y) precursor, a ratio $A_R/A_P$ of a maximum $A_R$ of absorbance in the region from 1,080 to 1,130 cm$^{-1}$ to a maximum $A_P$ of absorbance in the region from 850 to 950 cm$^{-1}$ is preferably 2.0 or less and more preferably 1.4 or less. The maximum $A_R$ of absorbance in the region from 1,080 to 1,130 cm$^{-1}$ is attributed to a M-O-P bond as previously described, while the maximum $A_P$ of absorbance in the region from 850 to 950 cm$^{-1}$ is attributed to a M-O-M bond. That is, the ratio $A_R/A_P$ can be considered a measure indicating the degree of conversion of the aluminum-containing metal oxide (Aa) to the reaction product (D). In the present invention, it is considered effective, in order to obtain a multilayer structure that has good barrier performance, to control the degree of conversion of the metal oxide (Aa) to the reaction product (D) at or below a certain level in the layer (Y) precursor having undergone the drying step. Thus, if the ratio $A_R/A_P$ is beyond the limit indicated above, the resulting multilayer structure may have insufficient barrier performance.

To control the solvent content and the average particle diameter of the reaction product (D) precursor to the desired ranges, the temperature employed for drying the applied coating liquid (S) is preferably lower than 140° C., more preferably 60° C. or higher and lower than 140° C., even more preferably 70° C. or higher and lower than 130° C., and still even more preferably 80° C. or higher and lower than 120° C., for example. The drying time is preferably, but not limited to, 1 second or more and less than 1 hour, more preferably 5 seconds or more and less than 15 minutes, and even more preferably 5 seconds or more and less than 300 seconds, for example. In particular, when the drying temperature is 100° C. or higher (for example, 100 to 140° C.), the drying time is preferably 1 second or more and less than 4 minutes, more preferably 5 seconds or more and less than 4 minutes, and even more preferably 5 seconds or more and less than 3 minutes. When the drying temperature is lower than 100° C. (for example, 60 to 99° C.), the drying time is preferably 3 minutes or more and less than 1 hour, more preferably 6 minutes or more and less than 30 minutes, and even more preferably 8 minutes or more and less than 25 minutes.

[Step (II)]

In the step (II), the precursor layer of the layer (Y), which has been formed in the step (I), is heat-treated at a temperature of 140° C. or higher to form the layer (Y). In the present invention, it is important to heat-treat the layer (Y) precursor having the predetermined solvent content and average particle diameter described above at a temperature of 140° C. or higher in order to achieve higher barrier performance. The heat treatment temperature in the step (II) is preferably higher than the drying temperature in the step (I).

In the step (II), the reaction of formation of the reaction product (D) takes place. To allow the reaction to take place to a sufficient extent, the heat treatment temperature is 140° C. or higher, preferably 170° C. or higher, more preferably 180° C. or higher, and even more preferably 190° C. or higher. A lowered heat treatment temperature increases the time required to achieve a sufficient reaction rate, thereby causing a reduction in production efficiency. The heat treatment temperature depends on, for example, the type of the base (X) and thus is not particularly limited. The heat treatment temperature may be 270° C. or lower. For example, when a thermoplastic resin film made of polyamide resin is used as the base (X), the heat treatment temperature is preferably 270° C. or lower. When a thermoplastic resin film made of polyester resin is used as the base (X), the heat treatment temperature is preferably 240° C. or lower. The heat treatment may be carried out, for example, in an air atmosphere, nitrogen atmosphere, or argon atmosphere. The heat treatment time is preferably 1 second to 1 hour, more preferably 1 second to 15 minutes, and even more preferably 5 to 300 seconds.

To control the solvent content and the average particle diameter of the reaction product (D) precursor to the desired ranges, the heat treatment is preferably carried out in two or more stages with varying treatment temperatures. That is, the step (II) preferably includes a first heat treatment step (II-1) and a second heat treatment step (II-2). When the heat treatment is carried out in two or more stages, the temperature of the heat treatment at the second stage (which will hereinafter be referred to as "second heat treatment") is preferably higher than the temperature of the heat treatment at the first stage (which will hereinafter be referred to as "first heat treatment"). The temperature of the second heat treatment is more preferably 15° C. or more higher, even more preferably 25° C. or more higher, and particularly preferably 35° C. or more higher, than the temperature of the first heat treatment.

To obtain a multilayer structure having good properties, the heat treatment temperature in the step (II) (or the temperature of the first heat treatment when the heat treatment consists of two or more stages) is preferably 30° C. or more higher, more preferably 50° C. or more higher, even more preferably 55° C. or more higher, and particularly preferably 60° C. or more higher, than the drying temperature in the step (I).

When the heat treatment in the step (II) is carried out in two or more stages, it is preferable that the temperature of the second heat treatment be higher than the temperature of the first heat treatment, the temperature of the first heat treatment be 140° C. or higher and lower than 200° C., and the temperature of the second heat treatment be 180° C. or higher and 270° C. or lower. It is more preferable that the temperature of the second heat treatment be 15° C. or more higher than the temperature of the first heat treatment, the temperature of the first heat treatment be 140° C. or higher and lower than 200° C., and the temperature of the second heat treatment be 180° C. or higher and 270° C. or lower. It is even more preferable that the temperature of the second heat treatment be 25° C. or more higher than the temperature of the first heat treatment, the temperature of the first heat treatment be 140° C. or higher and lower than 200° C., and the temperature of the second heat treatment be 180° C. or higher and 270° C. or lower. In particular, when the heat treatment temperatures are 200° C. or higher, the heat treatment times are preferably 0.1 seconds to 10 minutes, more preferably 0.5 seconds to 15 minutes, and even more preferably 1 second to 3 minutes. When the heat treatment temperatures are lower than 200° C., the heat treatment times are preferably 1 second to 15 minutes, more preferably 5 seconds to 10 minutes, and even more preferably 10 seconds to 5 minutes.

[Step (I')]

When the organic phosphorus compound (BO) is used in the production method, the production method may include the step (I') of applying a coating liquid (T) (second coating liquid) that is a mixture of the organic phosphorus compound (BO) and a solvent onto the layer (Y) obtained in the step (II). It is preferable to perform the step (I') to apply the coating liquid (T) (second coating liquid), which is a mixture of the organic phosphorus compound (BO) and a solvent, onto the layer (Y) as obtained after the first heat treatment step (II-1) in the step (II) and then perform the second heat treatment step (II-2) in the step (II).

The solvent used in the coating liquid (T) can be selected as appropriate depending on the type of the organic phosphorus compound (BO), and is preferably an alcohol such as methanol, ethanol, or isopropanol, water, or a mixed solvent thereof. The solvent may contain any of the following, as long as the dissolution of the organic phosphorus compound (BO) is not hindered: ethers such as tetrahydrofuran, dioxane, trioxane, and dimethoxyethane; ketones such as acetone and methyl ethyl ketone; glycols such as ethylene glycol and propylene glycol; glycol derivatives such as methyl cellosolve, ethyl cellosolve, and n-butyl cellosolve; glycerin; acetonitrile; amides such as dimethylformamide; dimethyl sulfoxide; and sulfolane.

The solids concentration in the coating liquid (T) is preferably 0.01 to 60 wt %, more preferably 0.1 to 50 wt %, and even more preferably 0.2 to 40 wt % in terms of the storage stability of the liquid or the quality of application of the liquid. The solids concentration can be determined by the same method as described for the coating liquid (S). The coating liquid (T) may contain another component (e.g., the polymer (F)) that may be contained in the layer (Y) described above, as long as the effect of the present invention is obtained.

As is the case for application of the coating liquid (S), the method for applying the coating liquid (T) is not particularly limited, and any known method can be employed. The application of the coating liquid (T) is followed by removal of the solvent. The method for removing the solvent from the coating liquid (T) is not particularly limited, and any known drying method can be employed. Examples of the drying method include hot air drying, hot roll contact drying, infrared heating, and microwave heating. The drying temperature is preferably equal to or lower than the onset temperature of fluidization of the base (X). The temperature employed for drying the applied coating liquid (T) may be, for example, around 90 to 240° C., and is preferably 100 to 200° C.

The step (II) can be performed using a heating system arranged following that for the step (I) or a heating system identical to that for the step (I) and capable of changing the heating temperature stepwise. The step (II) may be performed prior to the step (I').

In a preferred embodiment of the method for producing the multilayer structure (W) according to the present invention, the application of the coating liquid (S) is followed by drying to form the precursor layer of the layer (Y) in the step W, and then the heat treatment of the step (II) is performed. In this embodiment, the heat treatment temperature is preferably 30° C. or more higher, and more preferably 50° C. or more higher, than the drying temperature.

In another preferred embodiment of the method for producing the multilayer structure (W) according to the present invention, when the production method includes the step (I'), the application of the coating liquid (S) is followed by drying to form the precursor layer of the layer (Y) in the step (I), and then the first heat treatment step (II-1) of the step (II) is performed. This is followed by the application and drying of the coating liquid (T) in the step (I') and then by the second heat treatment step (II-2) of the step (II). In this embodiment, the temperature of the first heat treatment is preferably 30° C. or more higher, and more preferably 50° C. or more higher, than the drying temperature in the step (I). In addition, the temperature of the second heat treatment is preferably higher than the temperature of the first heat treatment.

In the multilayer structure (W) of the present invention, the layer (Y) may be stacked in direct contact with the base (X). Alternatively, the layer (Y) may be stacked over the base (X), with another member (e.g., the adhesive layer (G) or additional layer (J)) interposed therebetween.

[Extrusion Coating Lamination]

The multilayer structure (W) can further include a layer formed by extrusion coating lamination; for example, after the layer (Y) is stacked on the base (X) directly or with the adhesive layer (G) interposed therebetween, the additional layer (J) may be formed by extrusion coating lamination on the layer (Y) directly or with the adhesive layer (G) interposed therebetween. The extrusion coating lamination method available for use in the present invention is not particularly limited, and any known method can be used. In a typical method for extrusion coating lamination, a molten thermoplastic resin is fed to a T-die, and the thermoplastic resin is extruded through a flat slit of the T-die and then cooled to produce a laminated film.

Examples of the method for extrusion coating lamination include single lamination, sandwich lamination, and tandem lamination. The use of a layered product including the multilayer structure (W) of the present invention makes it possible to maintain high barrier performance after extrusion coating lamination and reduce the decrease in light transmittance caused by extrusion coating lamination.

[Adhesive Layer (G)]

In the multilayer structure (W), the adhesion between the base (X) and the layer (Y) can be enhanced by means of the adhesive layer (G). The adhesive layer (G) may be made of an adhesive resin. The adhesive layer (G) made of an adhesive resin can be formed by treating a surface of the base (X) with a known anchor coating agent or applying a known adhesive onto the surface of the base (X). The adhesive is preferably a two-component reactive polyurethane adhesive including a polyisocyanate component and a polyol component which are to be mixed and reacted. Addition of a small amount of an additive such as a known silane coupling agent to the anchor coating agent or adhesive may further enhance the adhesion. Examples of the silane coupling agent include, but are not limited to, silane coupling agents having a reactive group such as an isocyanate, epoxy, amino, ureido, or mercapto group. Strong adhesion between the base (X) and layer (Y) via the adhesive layer (G) makes it possible to effectively prevent deterioration in the gas barrier properties or appearance of the multilayer structure (W) when the multilayer structure (W) is subjected to a process such as printing or lamination. The thickness of the adhesive layer (G) is preferably 0.01 to 10.0 μm and more preferably 0.03 to 5.0 μm.

[Additional Layer (J)]

The multilayer structure (W) may further include the additional layer (J) for improving various properties (such as heat sealing properties, barrier properties, and mechanical properties). The multilayer structure (W) that includes the additional layer (J) can be produced, for example, by stacking the layer (Y) on the base (X) directly or with the adhesive layer (G) interposed therebetween and then by attaching or forming the additional layer (J) on the layer (Y) directly or with the adhesive layer (G) interposed therebetween. Examples of the additional layer (J) include, but are not limited to: ink layers; and thermoplastic resin layers such as a polyolefin layer and an ethylene-vinyl alcohol copolymer resin layer.

The multilayer structure (W) may include an ink layer on which a product name, decorative pattern, or the like is to be printed. The multilayer structure (W) that includes an ink layer can be produced, for example, by staking the layer (Y) on the base (X) directly or with the adhesive layer (G) interposed therebetween and then by forming the ink layer directly on the layer (Y). Examples of the ink layer include a film resulting from drying of a liquid prepared by dispersing a polyurethane resin containing a pigment (e.g., titanium dioxide) in a solvent. The ink layer may be a film resulting from drying of an ink or electronic circuit-forming resist containing a polyurethane resin free of any pigment or another resin as a main component. Methods that can be used to apply the ink layer onto the layer (Y) include gravure printing and various coating methods using a wire bar, a spin coater, or a die coater. The thickness of the ink layer is preferably 0.5 to 10.0 μm and more preferably 1.0 to 4.0 μm.

The polymer (Fa) has at least one functional group selected from the group consisting of an ether bond, a carbonyl group, a hydroxy group, and a carboxyl group which have high affinity to the adhesive layer (G) or additional layer (J) (e.g., the ink layer); therefore, when the layer (Y) of the multilayer structure (W) contains the polymer (Fa), the adhesion of the layer (Y) to the additional layer (J) is enhanced. This can enable the multilayer structure to maintain interlayer adhesion after a damp heat test and thus prevent the multilayer structure from suffering from an appearance defect such as delamination.

Placing a polyolefin layer as an outermost layer of the multilayer structure of the present invention can impart heat-sealing properties to the multilayer structure or improve the mechanical characteristics of the multilayer structure. In terms of, for example, the impartation of heat-sealing properties and the improvement in mechanical characteristics, the polyolefin is preferably polypropylene or polyethylene. It is also preferable to stack at least one film selected from the group consisting of a film made of a polyester, a film made of a polyamide, and a film made of a hydroxy group-containing polymer, in order to improve the mechanical characteristics of the multilayer structure. In terms of the improvement in mechanical characteristics, the polyester is preferably polyethylene terephthalate, the polyamide is preferably nylon-6, and the hydroxy group-containing polymer is preferably ethylene-vinyl alcohol copolymer. Between the layers there may, if desired, be provided an anchor coat layer or a layer made of an adhesive.

[Configuration of Multilayer Structure (W)]

Specific examples of the configuration of the multilayer structure (W) are listed below. The multilayer structure (W) may include a member (e.g., the adhesive layer (G) or additional layer (J)) other than the base (X) and layer (Y); however, the other member is omitted in the following list of specific examples. The multilayer structures listed below as specific examples may be stacked on top of each other or combined with each other.

(1) Layer (Y)/polyester layer,
(2) Layer (Y)/polyester layer/layer (Y),
(3) Layer (Y)/polyamide layer,
(4) Layer (Y)/polyamide layer/layer (Y),
(5) Layer (Y)/polyolefin layer,
(6) Layer (Y)/polyolefin layer/layer (Y),
(7) Layer (Y)/hydroxy group-containing polymer layer,
(8) Layer (Y)/hydroxy group-containing polymer layer/layer (Y),
(9) Layer (Y)/inorganic deposited layer/polyester layer,
(10) Layer (Y)/inorganic deposited layer/polyamide layer,
(11) Layer (Y)/inorganic deposited layer/polyolefin layer,
(12) Layer (Y)/inorganic deposited layer/hydroxy group-containing polymer layer The multilayer structure (W) used as a protective sheet for the electronic device of the present invention and the electronic device preferably have a total light transmittance of 86.5% or more, more preferably 90.0% or more, in terms of the application of the electronic device to a display, solar cell, etc. The multilayer structure (W) and the electronic device preferably have a haze value of 3.0 or less. The methods and conditions of measurement of the total light transmittance and haze value are as described in "EXAMPLES" below.

The multilayer structure (W) and protective sheet of the present invention have an oxygen transmission rate of 0.7 mL/(m²·day·atm) or less, preferably 0.5 mL/(m²·day·atm) or less, more preferably 0.3 mL/(m²·day·atm) or less, even more preferably 0.1 mL/(m²·day·atm) or less at 20° C. and 85% RH before and after a damp heat test. The use of the multilayer structure (W) and protective sheet that have a low oxygen transmission rate makes it possible to provide a fluorescent quantum dot-containing electronic device that suffers less reduction in quantum efficiency of the fluorescent quantum dots during actual use and retains its performance at a high level even after long-term use in air. The conditions of the damp heat test, and the method and conditions of measurement of the oxygen transmission rate, are as described in "EXAMPLES" below.

The multilayer structure (W) and protective sheet of the present invention have a moisture permeability of 1.0 g/(m²·day) or less, preferably 0.5 g/(m²·day) or less, more preferably 0.3 g/(m²·day) or less, even more preferably 0.2 g/(m²·day) or less at 40° C. and 90% RH before and after a damp heat test. The use of the multilayer structure (W) and protective sheet that have a low moisture permeability makes it possible to provide a fluorescent quantum dot-containing electronic device that suffers less reduction in quantum efficiency of the fluorescent quantum dots during actual use and retains its performance at a high level even after long-term use in air. The conditions of the damp heat test, and the method and conditions of measurement of the moisture permeability, are as described in "EXAMPLES" below.

EXAMPLES

Hereinafter, the present invention will be described in more detail by way of examples. The present invention is not limited by these examples in any respect, and many modifications are possible by any ordinarily skilled person in the art within the technical concept of the present invention. Analysis and evaluation in Examples and Comparative Examples given below were performed as will now be described.

(1) Measurement of Infrared Absorption Spectrum

The measurement was performed by attenuated total reflection spectroscopy using a Fourier transform infrared spectrophotometer. The measurement conditions were as follows.

Apparatus: Spectrum One, manufactured by PerkinElmer, Inc.
Measurement mode: Attenuated total reflection spectroscopy
Measurement range: 800 to 1,400 cm$^{-1}$ (2) Measurement of Respective Thicknesses of Layers Each multilayer structure was cut using a focused ion beam (FIB) to prepare a section for cross-sectional observation. The prepared section was secured to a sample stage with a carbon tape and subjected to platinum ion sputtering at an accelerating voltage of 30 kV for 30 seconds. The cross-section of the multilayer structure was observed using a field-emission transmission electron microscope to determine the respective thicknesses of the layers. The measurement conditions were as follows.

Apparatus: JEM-2100F, manufactured by JEOL Ltd.
Accelerating voltage: 200 kV
Magnification: ×250,000

(3) Measurement of Average Particle Diameter

The measurement was performed using an ultra-high-resolution field-emission scanning electron microscope. Specifically, a photograph of particles of the reaction product (D) was taken, and the average particle diameter of particles (100 or more particles) observed in a unit area of field of view in the photograph was calculated using an image-analyzing particle size distribution analysis software (Mac-View Ver. 4, manufactured by Mountech Co., Ltd.). The particle diameter of each particle was determined as an arithmetic mean of the maximum and minimum lengths of the particle, and an average primary particle diameter was calculated from the number and diameters of the particles. The measurement conditions were as follows.

Apparatus: SU8010, manufactured by Hitachi High-Technologies Corporation
Accelerating voltage: 0.5 kV
Magnification: ×100,000

(4) Measurement of Methanol Content

Each multilayer structure obtained after application and drying of a coating liquid (S-1) was cut into a strip, which was subjected to headspace GC-MS. As a result, water was only detected while no methanol was detected (lower detection limit: 5 ppm). The measurement conditions were as follows.

Apparatus: COMBI PAL Polaris Q Trace GC available from Thermo Fisher Scientific K.K.
Headspace temperature: 100° C.
Column temperature: Maintained at 40° C. for 5 minutes, then increased up to 140° C. at a rate of 5° C./min, and maintained at 140° C. for 10 minutes
Carrier gas: Helium
Carrier gas flow rate: 1.0 mL/min (5) Measurement of Water Content Each multilayer structure obtained after application and drying of the coating liquid (S-1) was cut into a strip, whose water content was measured with a Karl Fischer water content meter. The water content of the base treated under the same heating conditions (temperature and time) was also measured, and subtracted from the water content of the multilayer structure to determine the water content of the layer (Y) precursor. The measurement conditions were as follows.

Apparatus: CA-06, manufactured by Mitsubishi Kasei Corporation
Temperature: 100° C.
Carrier gas: Nitrogen
Carrier gas flow rate: 0.2 L/min
Titration method: Coulometric titration (6) Measurement of Oxygen Transmission Rate A sample was set to an oxygen transmission rate measurement apparatus in such a manner that the layer as the base faced the carrier gas side, and the oxygen transmission rate was measured by an equal pressure method. The measurement conditions were as follows.

Apparatus: MOCON OX-TRAN 2/20, manufactured by ModernControls, Inc.
Temperature: 20° C.
Humidity on oxygen feed side: 85% RH
Humidity on carrier gas side: 85% RH
Oxygen pressure: 1.0 atm
Carrier gas pressure: 1.0 atm (7) Measurement of Moisture Permeability A sample was set to a water vapor transmission rate measurement apparatus in such a manner that the layer as the base faced the carrier gas side, and the moisture permeability (water vapor transmission rate) was measured by an equal pressure method. The measurement conditions were as follows.

Apparatus: MOCON PERMATRAN W3/33, manufactured by ModernControls, Inc.

Temperature: 40° C.

Humidity on water vapor feed side: 90% RH

Humidity on carrier gas side: 0% RH (8) Measurement of Total Light Transmittance and Haze Value The total light transmittance and haze value were measured using a haze meter.

Apparatus: HR-100, manufactured by MURAKAMI COLOR RESEARCH LABORATORY Co., Ltd.

Conditions: Complying with ISO 13468-1

Production Example of Coating Liquid (S-1)

Distilled water in an amount of 230 parts by weight was heated to 70° C. under stirring. Triisopropoxyaluminum in an amount of 88 parts by weight was added dropwise to the distilled water over 1 hour, the liquid temperature was gradually increased to 95° C., and isopropanol generated was distilled off. In this manner, hydrolytic condensation was performed. To the resulting liquid was added 4.0 parts by weight of a 60 wt % aqueous nitric acid solution, and this was followed by stirring at 95° C. for 3 hours to deflocculate agglomerates of particles of the hydrolytic condensate. After that, the liquid was concentrated so that the concentration of solids calculated as aluminum oxide was adjusted to 10 wt %. To 22.50 parts by weight of the solution thus obtained were added 54.29 parts by weight of distilled water and 18.80 parts by weight of methanol. This was followed by stirring to obtain a homogeneous dispersion. Subsequently, 4.41 parts by weight of an 85 wt % aqueous phosphoric acid solution was added dropwise to the dispersion under stirring, with the liquid temperature held at 15° C. The stirring was continued at 15° C. until a viscosity of 1,500 mPa·s was reached. The intended coating liquid (S-1) was thus obtained. In the coating liquid (S-1), the molar ratio between aluminum atoms and phosphorus atoms, as expressed by aluminum atoms:phosphorus atoms, was 1.15:1.00.

Synthesis Example of Organic Phosphorus Compound (BO-1)

Under a nitrogen atmosphere, 10 g of vinylphosphonic acid and 0.025 g of 2,2'-azobis(2-amidinopropane) dihydrochloride were dissolved in 5 g of water, and the resulting solution was stirred at 80° C. for 3 hours. After being cooled, the polymer solution was diluted by addition of 15 g of water and then filtered using "Spectra/Por" (registered trademark), a cellulose membrane manufactured by Spectrum Laboratories, Inc. Water was removed from the filtrate by distillation, followed by vacuum drying at 50° C. for 24 hours, thus giving a polymer (BO-1). The polymer (BO-1) was poly (vinylphosphonic acid). As a result of GPC analysis, the number-average molecular weight of the polymer was determined to be 10,000 on a polyethylene glycol-equivalent basis.

Production Example of Coating Liquid (T-1)

The organic phosphorus compound (BO-1) obtained in the above synthesis example was dissolved in a mixed solvent of water and methanol (at a weight ratio, water: methanol, of 7:3) to obtain a coating liquid (T-1) having a solids concentration of 1 wt %.

Production Example of Coating Liquid (T-2)

There was prepared a mixture containing 91 wt % of the organic phosphorus compound (BO-1) obtained in the above synthesis example and 9 wt % of polyvinyl alcohol having a weight-average molecular weight of 100,000 (PVA 124, manufactured by KURARAY CO., LTD.) as the polymer (F). This mixture was dissolved in a mixed solvent of water and methanol (at a weight ratio, water methanol, of 7:3) to obtain a coating liquid (T-2) having a solids concentration of 1 wt %.

Production Example of Coating Liquid (T-3)

There was prepared a mixture containing 91 wt % of the organic phosphorus compound (BO-1) obtained in the above synthesis example and 9 wt % of polyethylene oxide having a weight-average molecular weight of 60,000 ("ALKOX (registered trademark) L-6" manufactured by Meisei Chemical Works, Ltd.) as the polymer (F). This mixture was dissolved in a mixed solvent of water and methanol (at a weight ratio, water:methanol, of 7:3) to obtain a coating liquid (T-3) having a solids concentration of 1 wt %.

Example 1-1

First, "Lumirror (registered trademark) P60" (thickness: 12 μm) manufactured by TORAY INDUSTRIES, INC., which is an oriented polyethylene terephthalate film, was prepared as the base (X) (this film may be simply referred to as "X-1" hereinafter). The coating liquid (S-1) was applied onto the base using a bar coater in such a manner that the dry thickness would be 0.30 μm. The film of the applied liquid was dried at 80° C. for 10 minutes to form a precursor of a layer (Y-1) on the base. In this way, a structure having a configuration of "base (X-1)/layer (Y-1) precursor" was obtained. For the structure obtained, the infrared absorption spectrum of the layer (Y) precursor, the average particle diameter of the reaction product (D) precursor, and the solvent content (the total content of methanol and water) were measured using the methods described above. Subsequently, the structure was heat-treated at 180° C. for 3 minutes and then at 220° C. for 10 seconds to form the layer (Y-1). In this way, a multilayer structure (W1-1) having a configuration of "base (X-1)/layer (Y-1)" was obtained.

Figure 8:
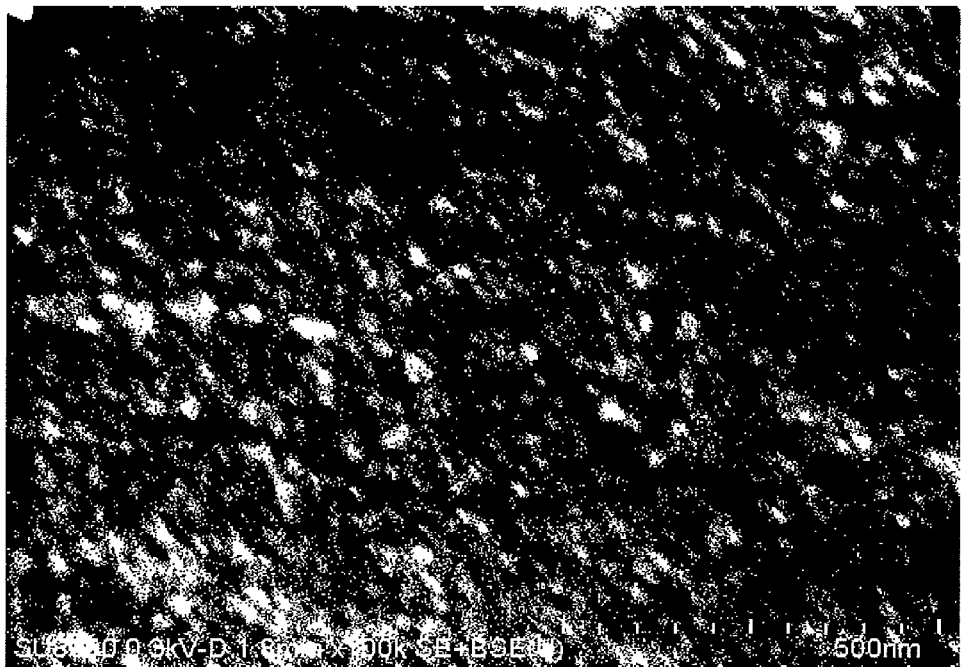
FIG. 8 is a SEM photograph of a precursor of a layer (Y-1) of a multilayer structure (W) obtained in Example 1-1.
Figure 9:
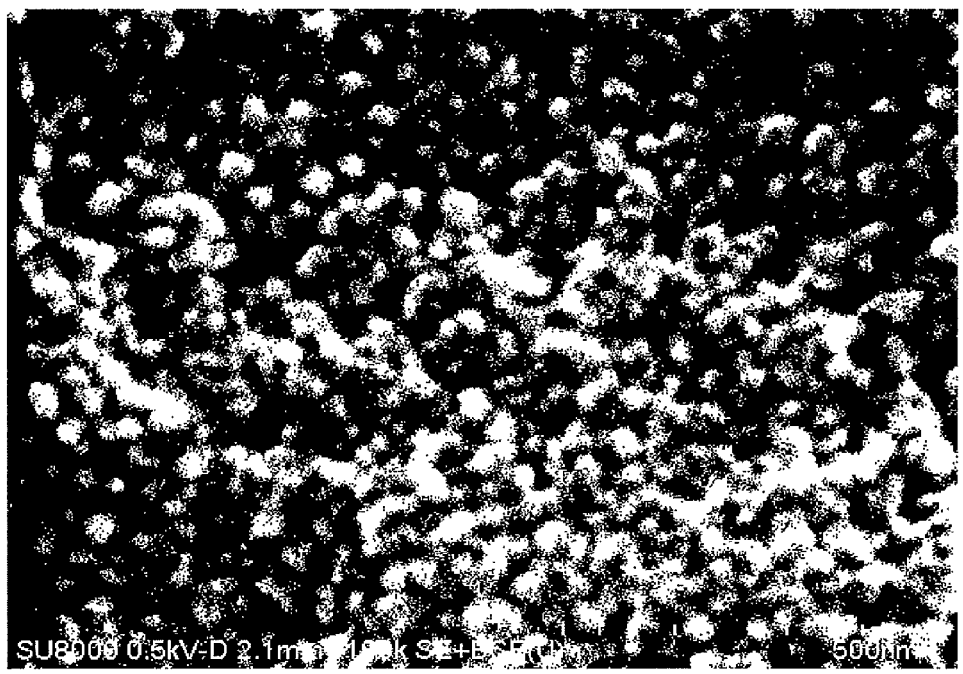
FIG. 9 is a SEM photograph of the layer (Y-1) of the multilayer structure (W) obtained in Example 1-1.
Figure 10:
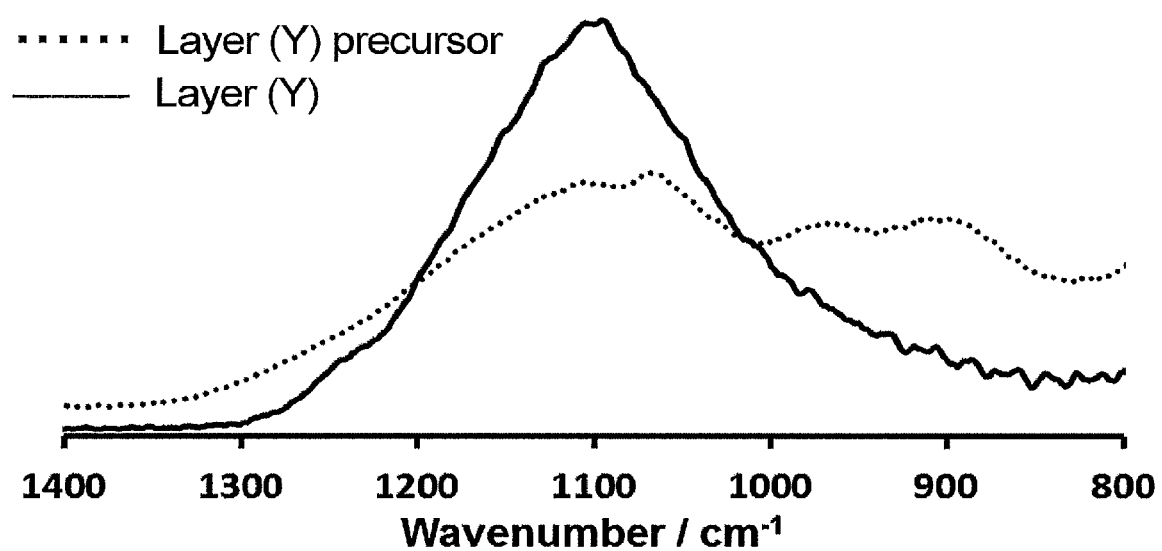
FIG. 10 shows an infrared absorption spectrum of the precursor of the layer (Y-1) of the multilayer structure (W) obtained in Example 1-1 and an infrared absorption spectrum of the layer (Y-1).

Table 1 shows the average particle diameter of the reaction product (D) precursor, the solvent content, and the $A_R/A_P$ in the layer (Y-1) precursor and also shows the average particle diameter of the reaction product (D) in the layer (Y-1). FIG. 8 shows a SEM photograph of the precursor of the layer (Y-1) of the multilayer structure (W1-1), FIG. 9 shows a SEM photograph of the layer (Y-1), and FIG. 10 shows the results of measurement of infrared absorption spectra of the precursor and the layer (Y-1).

An adhesive layer was formed on the multilayer structure (W1-1) as obtained above, and an acrylic resin film ("TECHNOLLOY" (registered trademark) manufactured by Sumitomo Chemical Co., Ltd. and having a thickness of 50 μm) was laminated onto the adhesive layer to obtain a layered product. Subsequently, an adhesive layer was formed on the multilayer structure (W1-1) of the layered product, which was then laminated to a polyethylene terephthalate film. In this way, a protective sheet (1-1) having a configuration of "polyethylene terephthalate film/ adhesive layer/base (X-1)/layer (Y-1)/adhesive layer/acrylic resin film" was obtained. The two adhesive layers were each formed by applying a two-component adhesive in such a manner that the dry thickness would be 3 μm and then by drying the adhesive. The two-component adhesive used was a two-component reactive polyurethane adhesive composed of "A-1102" of "TAKELAC" (registered trademark) manufactured by Mitsui Chemicals, Inc. and "A-3070" of "TAK-ENATE" (registered trademark) manufactured by Mitsui Chemicals, Inc. The polyethylene terephthalate film used was "Q1A15" (thickness: 50 µm) of "SHINEBEAM" (registered trademark) manufactured by TOYOBO CO., LTD., which is a polyethylene terephthalate film with improved adhesion to ethylene-vinyl acetate copolymer. The oxygen transmission rate, moisture permeability, total light transmittance, and haze value of the protective sheet (1-1) obtained were measured. The results are shown in Table 1.

Subsequently, the protective sheet (1-1) was examined for durability by performing a test (damp heat test) in which the protective sheet was stored at atmospheric pressure, 85° C., and 85% RH for 1,000 hours using a thermo-hygrostat. The results of measurement of the oxygen transmission rate and moisture permeability of the protective sheet (1-1) having undergone the test are shown in Table 1.

Example 1-2

A multilayer structure (W2-1) having a configuration of "base (X-1)/layer (Y-2)" was fabricated in the same manner as in the fabrication of the multilayer structure (W1-1) of Example 1-1, except for changing the drying of the applied coating liquid (S-1) from drying at 80° C. for 10 minutes to drying at 120° C. for 3 minutes. In addition, a protective sheet (2-1) was fabricated in the same manner as in the fabrication of the protective sheet (1-1) of Example 1-1, except for substituting the multilayer structure (W2-1) for the multilayer structure (W1-1).

Example 1-3

A multilayer structure (W3-1) having a configuration of "base (X-1)/layer (Y-3)" was fabricated in the same manner as in the fabrication of the multilayer structure (W1-1) of Example 1-1, except for changing the drying of the applied coating liquid (S-1) from drying at 80° C. for 10 minutes to drying at 120° C. for 1 minute and changing the thickness of the dried layer (Y) from 0.30 µm to 0.45 µm. In addition, a protective sheet (3-1) was fabricated in the same manner as in the fabrication of the protective sheet (1-1) of Example 1-1, except for substituting the multilayer structure (W3-1) for the multilayer structure (W1-1).

Example 1-4

A multilayer structure (W4-1) having a configuration of "base (X-1)/layer (Y-4)" was fabricated in the same manner as in the fabrication of the multilayer structure (W1-1) of Example 1-1, except that the heat treatment at 180° C. for 3 minutes was followed by applying the coating liquid (T-1) using a bar coater so that the ratio $W_{BO}/W_{BI}$ between the weight $W_{BI}$ of the inorganic phosphorus compound (BI) and the weight $W_{BO}$ of the organic phosphorus compound (BO) was 1.10/98.90, then by drying at 110° C. for 3 minutes, and then by heat treatment at 220° C. for 1 minute. In addition, a protective sheet (4-1) was fabricated in the same manner as in the fabrication of the protective sheet (1-1) of Example 1-1, except for substituting the multilayer structure (W4-1) for the multilayer structure (W1-1).

Examples 1-5 and 1-6

Multilayer structures (W5-1) and (W6-1) were fabricated in the same manner as in the fabrication of the multilayer structure (W4-1) of Example 1-4, except for substituting the coating liquids (T-2) and (T-3) for the coating liquid (T-1). In addition, protective sheets (5-1) and (6-1) were fabricated in the same manner as in the fabrication of the protective sheet (1-1) of Example 1-1, except for substituting the multilayer structures (W5-1) and (W6-1) for the multilayer structure (W1-1).

Comparative Example 1-1

A multilayer structure (CW1-1) having a configuration of "base (X-1)/layer (CY-1)" was fabricated as in the fabrication of the multilayer structure (W1-1) of Example 1-1, except for changing the drying of the applied coating liquid (S-1) from drying at 80° C. for 10 minutes to drying at 160° C. for 1 minute. In addition, a protective sheet (C1-1) was fabricated in the same manner as in the fabrication of the protective sheet (1-1) of Example 1-1, except for substituting the multilayer structure (CW1-1) for the multilayer structure (W1-1).

Comparative Example 1-2

A multilayer structure (CW2-1) having a configuration of "base (X-1)/layer (CY-2)" was fabricated as in the fabrication of the multilayer structure (W1-1) of Example 1-1, except for changing the drying of the applied coating liquid (S-1) from drying at 80° C. for 10 minutes to drying at 80° C. for 1 minute. In addition, a protective sheet (C2-1) was fabricated in the same manner as in the fabrication of the protective sheet (1-1) of Example 1-1, except for substituting the multilayer structure (CW2-1) for the multilayer structure (W1-1).

The various properties of the multilayer structures (W2-1) to (W6-1), multilayer structures (CW1-1) to (CW2-1), protective sheets (2-1) to (6-1), and protective sheets (C1-1) to (C2-1) were measured in the same manner as in Example 1-1. The results are shown in Table 1.

TABLE 1

| | Base (X) | First coating liquid No. | Second coating liquid | | | | Layer (Y) precursor | | | Layer (Y) | | Oxygen transmission rate | | Moisture permeability | | Total light transmittance (%) | Haze value (%) |
|---|---|---|---|---|---|---|---|---|---|---|---|---|---|---|---|---|---|
| | | | No. | Organic phosphorus compound (BO) Name | Polymer (F) Type | Weight ratio (BO):(F) | Solvent content (wt %) | Average particle diameter (nm) | $A_R/A_P$ | Thickness (µm) | Average particle diameter (nm) | Before damp heat test (mL/(m²·day·atm)) | After damp heat test (mL/(m²·day·atm)) | Before damp heat test (mL/(m²·day)) | After damp heat test (mL/(m²·day)) | | |
| Example 1-1 | X-1 | S-1 | — | — | — | — | 0.2 | 4 | <1.1 | 0.30 | 30 | <0.1 | <0.1 | 0.2 | 0.2 | 89.2 | 2.8 |

TABLE 1-continued

| | Base (X) | First coating liquid No. | Second coating liquid Organic phosphorus compound (BO) No. | Second coating liquid Organic phosphorus compound (BO) Name | Second coating liquid Polymer (F) Type | Second coating liquid Weight ratio (BO):(F) | Layer (Y) precursor Solvent content (wt %) | Layer (Y) precursor Average particle diameter (nm) | $A_R/A_P$ | Layer (Y) Thickness (μm) | Layer (Y) Average particle diameter (nm) | Oxygen transmission rate Before damp heat test (mL/(m²·day·atm)) | Oxygen transmission rate After damp heat test (mL/(m²·day·atm)) | Moisture permeability Before damp heat test (mL/(m²·day)) | Moisture permeability After damp heat test (mL/(m²·day)) | Total light transmittance (%) | Haze value (%) |
|---|---|---|---|---|---|---|---|---|---|---|---|---|---|---|---|---|---|
| Example 1-2 | X-1 | S-1 | — | — | — | — | 0.1 | 2 | 1.9 | 0.30 | 30 | <0.1 | <0.1 | 0.1 | 0.1 | 90.2 | 2.8 |
| Example 1-3 | X-1 | S-1 | — | — | — | — | 0.8 | 1 | 1.4 | 0.45 | 30 | <0.1 | <0.1 | 0.2 | 0.2 | 90.1 | 2.8 |
| Example 1-4 | X-1 | S-1 | T-1 | PVPA | — | 100:0 | 0.2 | 4 | <1.1 | 0.30 | 30 | <0.1 | <0.1 | 0.2 | 0.2 | 88.8 | 2.9 |
| Example 1-5 | X-1 | S-1 | T-2 | PVPA | PVA | 91:9 | 0.2 | 4 | <1.1 | 0.30 | 30 | <0.1 | <0.1 | 0.2 | 0.2 | 88.6 | 2.9 |
| Example 1-6 | X-1 | S-1 | T-3 | PVPA | PEO | 91:9 | 0.2 | 4 | <1.1 | 0.30 | 30 | <0.1 | <0.1 | 0.1 | 0.1 | 90.2 | 2.9 |
| Comparative Example 1-1 | X-1 | S-1 | — | — | — | — | 0.3 | 60 | 3.2 | 0.30 | 60 | 0.2 | 1.0 | 0.6 | 1.2 | 87.0 | 3.1 |
| Comparative Example 1-2 | X-1 | S-1 | — | — | — | — | 0.7 | 4 | <1.1 | 0.30 | 60 | 0.5 | 0.8 | 0.8 | 1.5 | 86.8 | 3.1 |

[Abbreviations in the table]
PVPA: Poly(vinylphosphonic acid)
PVA: Polyvinyl alcohol
PEO: Polyethylene oxide In Examples and Comparative Examples given below, quantum efficiency and spectral radiant energy were measured with a quantum efficiency measurement system, QE-1000, manufactured by Otsuka Electronics Co., Ltd. The spectral radiant energy was a radiant energy at the fluorescence wavelength of fluorescent quantum dots used in the examples.

Fluorescent Quantum Dot-Containing Electronic Device

Example 2-1

An amount of 5 g of cycloolefin polymer (ZEONEX (registered trademark) 480R manufactured by Zeon Corporation; amorphous rein containing the structure of the formula [Q-1]) and 5 g of anhydrous toluene (manufactured by Wako Pure Chemical Industries, Ltd.) subjected to freezing and degassing under vacuum followed by storage under an argon gas atmosphere were placed in a 50 mL glass screw-cap bottle under an argon gas atmosphere and were stirred with a roller stirrer at room temperature to dissolve the cycloolefin polymer in the anhydrous toluene and thus obtain a resin solution (r1).

A toluene dispersion of fluorescent quantum dots which was prepared at a concentration of 82 mg/mL was added in an amount of 3.05 g to the obtained resin solution (r1) under an argon gas atmosphere. The fluorescent quantum dots used were core-shell nanoparticles prepared using myristic acid as a capping agent; the core-shell structure of each particle was composed of a InP core having a diameter of 2.1 nm and a ZnS shell. The addition of the dispersion was followed by thorough kneading using a planetary centrifugal mixer, ARV310-LED, manufactured by THINKY CORPORATION, thus yielding a dispersion (fluorescent quantum dot-containing composition) containing the fluorescent quantum dots in an amount of 5 mass % relative to the amount of the cycloolefin polymer. This dispersion was poured inside a silicone ring (with an outer diameter of 55 mm, an inner diameter of 50 mm, and a thickness of 1 mm) placed on a petri dish made of polymethylpentene. The dispersion was left in this state to dry under an argon gas atmosphere to obtain a sheet-shaped product, which was then dried in an inert oven under a nitrogen stream at 40° C. for 5 hours to fully remove the solvent. Thus, a fluorescent quantum dot-dispersed resin shaped product was obtained.

To protect the fluorescent quantum dots from air, the protective sheet (1-1) of Example 1-1 was then attached to the surface of the fluorescent quantum dot-dispersed resin shaped product using an adhesive resin so that a gas barrier layer was formed. Thus, a fluorescent quantum dot-containing structure (u1) was obtained. The thickness of the gas barrier layer was 12.5 μm. The quantum efficiency of the fluorescent quantum dot-containing structure (u1) was measured to be 74% using a quantum efficiency measurement system, QE-1000, manufactured by Otsuka Electronics Co., Ltd. This value is comparable to a quantum efficiency of 80% obtained when the same measurement was performed on the toluene dispersion of the fluorescent quantum dots from which the structure was formed.

The fluorescent quantum dot-containing structure (u1) was placed over a 22-mW, 450-nm blue LED package, which was caused to emit light in air for 2,000 consecutive hours. The spectral radiant energy of the fluorescent quantum dots at the beginning of LED light emission was 0.42 (mW/nm), while the spectral radiant energy after the lapse of 2,000 hours was 0.41 (mW/nm). That is, the spectral radiant energy after the lapse of 2,000 hours was at a high level corresponding to 97.6% of the initial value.

Example 2-2

The fluorescent quantum dot-dispersed resin shaped product as obtained in Example 2-1 was processed using a 180° C.-heated press machine at a pressing pressure of 20 MPa to obtain a fluorescent quantum dot-containing resin film having a thickness of 100 μm.

To protect the fluorescent quantum dots from air, the protective sheet (1-1) of Example 1-1 was then attached to the surface of the fluorescent quantum dot-containing resin film using an adhesive resin so that a gas barrier layer was formed. Thus, a fluorescent quantum dot-containing structure (u2) was obtained. The thickness of the gas barrier layer was 12.5 μm.

The structure (u2) was subjected to the measurement of quantum efficiency, spectral radiant energy at the beginning of light emission, and spectral radiant energy after the lapse of 2,000 hours in the same manner as in Example 2-1. The results are shown in Table 2. The quantum efficiency was good, in particular 76%. The spectral radiant energy after the lapse of 2,000 hours was at a high level corresponding to 97.4% of the initial value.

Comparative Example 2

A fluorescent quantum dot-containing structure (u3) was obtained in the same manner as in Example 2-1, except for attaching the protective sheet (C1-1) of Comparative Example 1-1 to the surface of the fluorescent quantum dot-dispersed resin shaped product to protect the fluorescent quantum dots from air. The quantum efficiency of the fluorescent quantum dot-containing structure (u3) was measured to be 76% using a quantum efficiency measurement system, QE-1000, manufactured by Otsuka Electronics Co., Ltd. This value is comparable to a quantum efficiency of 82% obtained when the same measurement was performed on the toluene dispersion of the fluorescent quantum dots from which the structure was formed.

The fluorescent quantum dot-containing structure (u3) was placed over a 22-mW, 450-nm blue LED package, which was caused to emit light in air for 2,000 consecutive hours. The results of measurement of the spectral radiant energy at the beginning of light emission and the spectral radiant energy after the lapse of 2,000 hours are shown in Table 2. The spectral radiant energy was reduced to 78.5% of the initial value after the lapse of 2,000 hours.

Comparative Example 3

A fluorescent quantum dot-containing structure (u4) was obtained in the same manner as in Example 2-1, except for attaching an EVOH film (a 15-μm-thick film fabricated by co-extruding "Soarnol D2908" manufactured by The Nippon Synthetic Chemical Industry Co., Ltd.; oxygen transmission rate=0.5 mL/(m$^2$·day), moisture permeability=130 g/m$^2$·24 hrs) to the surface of the fluorescent quantum dot-dispersed resin shaped product to protect the fluorescent quantum dots from air. The quantum efficiency of the fluorescent quantum dot-containing structure (u4) was measured to be 76% using a quantum efficiency measurement system, QE-1000, manufactured by Otsuka Electronics Co., Ltd. This value is comparable to a quantum efficiency of 82% obtained when the same measurement was performed on the toluene dispersion of the fluorescent quantum dots from which the structure was formed.

The fluorescent quantum dot-containing structure (u4) was placed over a 22-mW, 450-nm blue LED package, which was caused to emit light in air for 2,000 consecutive hours. The results of measurement of the spectral radiant energy at the beginning of light emission and the spectral radiant energy after the lapse of 2,000 hours are shown in Table 2. The spectral radiant energy was reduced to 71.4% of the initial value after the lapse of 2,000 hours.

TABLE 2

|  | Gas barrier layer | Quantum efficiency (%) | Initial spectral radiant energy (mW/nm) | Spectral radiant energy after light emission for 2,000 consecutive hours (mW/nm) | Performance retention (%) |
| --- | --- | --- | --- | --- | --- |
| Example 2-1 | Example 1-1 | 74 | 0.42 | 0.41 | 97.6 |
| Example 2-2 | Example 1-1 | 76 | 0.39 | 0.38 | 97.4 |
| Comparative Example 2 | Comparative Example 1-1 | 76 | 0.42 | 0.33 | 78.5 |
| Comparative Example 3 | EVOH | 76 | 0.42 | 0.30 | 71.4 |

INDUSTRIAL APPLICABILITY

According to the present invention, it is possible to obtain a fluorescent quantum dot-containing electronic device including a protective sheet that has good optical properties and exhibits good gas barrier properties and good water vapor barrier properties both before and after a damp heat test. Thus, according to the present invention, it is possible to obtain an electronic device capable of maintaining good properties not only during production and distribution but also during actual use which often lasts for a long period of time. According to the present invention, it is further possible to provide a fluorescent quantum dot-containing electronic device that suffers less reduction in quantum efficiency and retains its performance at a high level even after long-term use (light emission for 2,000 consecutive hours, for example) in air.

The invention claimed is:

1. A fluorescent quantum dot-containing electronic device, comprising a protective sheet, wherein:
    the protective sheet comprises a multilayer structure (W) comprising a base (X) and a layer (Y) stacked on the base (X);
    the layer (Y) comprises a reaction product (D) of an aluminum-containing compound (A) and a phosphorus compound (B); and
    the reaction product (D) has an average particle diameter of 5 to 50 nm.

2. The electronic device according to claim 1, comprising a layer containing fluorescent quantum dots, wherein the protective sheet is disposed on one side or both sides of the layer.

3. The electronic device according to claim 1, wherein the phosphorus compound (B) is an inorganic phosphorus compound (BI).

4. The electronic device according to claim 1, wherein the aluminum-containing compound (A) is an aluminum-containing metal oxide (Aa).

5. The electronic device according to claim 1, wherein the average particle diameter of the reaction product (D) is 20 to 40 nm.

6. The electronic device according to claim 1, wherein a moisture permeability at 40° C. and 90% RH is 1.0 g/(m$^2$·day) or less.

7. The electronic device according to claim 1, wherein the base (X) comprises a thermoplastic resin film.

8. The electronic device according to claim 1, wherein the layer (Y) comprises a polymer (F) having at least one functional group selected from the group consisting of a carbonyl group, a hydroxy group, a carboxyl group, a carboxylic anhydride group, and a salt of a carboxyl group.

9. The electronic device according to claim 1, wherein the multilayer structure (W) further comprises a layer (Z) disposed contiguous to the layer (Y), and the layer (Z) contains a polymer (BOa) having a phosphorus atom-containing functional group.

10. The electronic device according to claim 9, wherein the polymer (BOa) contained in the layer (Z) is poly(vinylphosphonic acid) or poly(2-phosphonooxyethyl methacrylate).

11. A method for producing the fluorescent quantum dot-containing electronic device according to claim 1, the method comprising:
(I) applying a coating liquid (S) comprising the aluminum-containing compound (A), the phosphorus compound (B), and a solvent onto the base (X) to form a layer (Y) precursor comprising a reaction product (D) precursor; and
(II) heat-treating the layer (Y) precursor at a temperature of 140° C. or higher to form the layer (Y),
wherein:
the layer (Y) precursor formed in the step (I) has a solvent content of 0.4 wt % or less; and
the reaction product (D) precursor has an average particle diameter of less than 5 nm.

12. The production method according to claim 11, wherein the phosphorus compound (B) is an inorganic phosphorus compound (BI).

13. The production method according to claim 11, wherein the aluminum-containing compound (A) is an aluminum-containing metal oxide (Aa).

14. The production method according to claim 11, wherein the step (I) comprises a drying step of removing the solvent from the coating liquid (S) after applying the coating liquid (S) onto the base (X), and a drying temperature in the drying step is lower than 140° C.

15. The production method according to claim 11, wherein, in an infrared absorption spectrum of the layer (Y) precursor, a ratio $A_R/A_P$ of a maximum $A_R$ of absorbance in a region from 1,080 to 1,130 cm$^1$ to a maximum $A_P$ of absorbance in a region from 850 to 950 cm$^1$ is 2.0 or less.

* * * * *